(12) United States Patent
Abe

(10) Patent No.: US 9,798,233 B2
(45) Date of Patent: Oct. 24, 2017

(54) RADIATION-SENSITIVE RESIN COMPOSITION AND ELECTRONIC DEVICE

(71) Applicant: ZEON CORPORATION, Tokyo (JP)

(72) Inventor: Satoshi Abe, Tokyo (JP)

(73) Assignee: ZEON CORPORATION, Tokyo (JP)

(*) Notice: Subject to any disclaimer, the term of this patent is extended or adjusted under 35 U.S.C. 154(b) by 0 days.

(21) Appl. No.: 14/913,489

(22) PCT Filed: Sep. 2, 2014

(86) PCT No.: PCT/JP2014/072984
§ 371 (c)(1),
(2) Date: Feb. 22, 2016

(87) PCT Pub. No.: WO2015/033901
PCT Pub. Date: Mar. 12, 2015

(65) Prior Publication Data
US 2016/0202607 A1    Jul. 14, 2016

(30) Foreign Application Priority Data

Sep. 6, 2013    (JP) ................................. 2013-184720

(51) Int. Cl.
*G03F 7/038* (2006.01)
*G03F 7/004* (2006.01)

(52) U.S. Cl.
CPC ............ *G03F 7/038* (2013.01); *G03F 7/0045* (2013.01); *G03F 7/0046* (2013.01)

(58) Field of Classification Search
None
See application file for complete search history.

(56) References Cited

U.S. PATENT DOCUMENTS

| | | | |
|---|---|---|---|
| 5,189,119 A * | 2/1993 | Nishida | C08G 59/3218 428/418 |
| 2007/0225458 A1 | 9/2007 | Kimura et al. | |
| 2009/0239080 A1 | 9/2009 | Ito et al. | |
| 2010/0196822 A1 | 8/2010 | Sasaki et al. | |
| 2011/0172349 A1 | 7/2011 | Ito et al. | |
| 2013/0012618 A1 | 1/2013 | Hiro et al. | |
| 2013/0235119 A1 | 9/2013 | Takahashi et al. | |
| 2016/0202607 A1 * | 7/2016 | Abe | G03F 7/038 430/280.1 |

FOREIGN PATENT DOCUMENTS

| | | | |
|---|---|---|---|
| JP | 2006-265322 A | 10/2006 | |
| JP | 2010-197996 A | 9/2010 | |
| JP | 2010-256508 A | * 11/2010 | |
| JP | 5240380 B1 | 7/2013 | |
| JP | 2014-137424 A | 7/2014 | |
| JP | 2014-137429 A | * 7/2014 | |
| WO | 2005/116038 A1 | 12/2005 | |
| WO | 2008/026401 A1 | 3/2008 | |
| WO | 2008/117619 A1 | 10/2008 | |
| WO | 2010/050357 A1 | 5/2010 | |
| WO | 2010/067665 A1 | 6/2010 | |
| WO | 2012/081507 A1 | 6/2012 | |

OTHER PUBLICATIONS

English translation of JP, 2014-137429, A (2014) from machine translation from AIPN Japan Patent Office National center for Industrial Property Information and Training, generated Jun. 3, 2016, 36 pages.*
English Abstract and structure of JP 2014-137429 a from Accession No. 2014:1214266, and SciFinder database obtained Jun. 2016, 3 pages.*
Full English translation of JP, 2014-137424, A (2014) from machine translation from AIPN Japan Patent Office National center for Industrial Property Information and Training, generated Jan. 3, 2017, 28 pages.*
International Search Report dated Nov. 4, 2014, issued in counterpart Application No. PCT/JP2014/072984 (2 pages).

* cited by examiner

*Primary Examiner* — Cynthia Hamilton
(74) *Attorney, Agent, or Firm* — Westerman, Hattori, Daniels & Adrian, LLP

(57) ABSTRACT

A radiation-sensitive resin composition containing an alicyclic olefin polymer which has an acidic group (A), a sulfonium salt-based photoacid generator (B) which is represented by the following general formula (1), and a crosslinking agent (C) is provided.

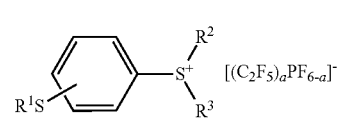

(1)

(In the above general formula (1), $R^1$, $R^2$, and $R^3$ respectively independently are a $C_6$ to $C_{30}$ aryl group, $C_4$ to $C_{30}$ heterocyclic group, $C_1$ to $C_{30}$ alkyl group, $C_2$ to $C_{30}$ alkenyl group, or $C_2$ to $C_{30}$ alkynyl group, the groups being optionally substituted, and "a" is an integer of 1 to 5.)

10 Claims, No Drawings

RADIATION-SENSITIVE RESIN COMPOSITION AND ELECTRONIC DEVICE

TECHNICAL FIELD

The disclosure invention relates to a radiation-sensitive resin composition and an electronic device which is provided with a resin film comprised of this radiation-sensitive resin composition, more particularly relates to a radiation-sensitive resin composition which can give a resin film which is high in exposure sensitivity, has a high transparency even after baking in an oxidizing atmosphere, and is excellent in low corrosiveness to metal and an electronic device which is provided with a resin film comprised of this radiation-sensitive resin composition.

BACKGROUND ART

An integrated circuit device, liquid crystal display device, organic EL device, solid state imaging device, LED (light emitting diode) device, MEMS mirror device, printed circuit board, and other electronic devices are provided with protective films for preventing deterioration or damage of the device itself, flattening films for flattening the device surfaces or interconnects, electrical insulating films for ensuring the electrical insulation property, pixel separating films for separating light emitting diodes, and optical films for focusing and diffusing light constituted by various resin films. Further, display devices, integrated circuit devices and other devices for thin film transistor-type liquid crystals are provided with resin films as interlayer insulating films for insulating between interconnects arranged in layers. Along with the higher densities of interconnects and devices, for these flattening films, insulating films and other resin films, radiation-sensitive resin compositions for forming such resin films which are excellent in electrical characteristics and transparency being sought. Further, recently, organic EL devices have been provided with pixel separation films or resin films for flattening devices. To extend the lifetime of light emitting devices, radiation-sensitive resin compositions which are high in insulating ability, excellent in transparency, and excellent in low gas generation characteristic are being sought.

In the past, as the resin materials for forming such resin films, epoxy resins and other heat curable resin materials have been generally used. In recent years, along with the higher density of interconnects and devices, development of new resin materials excellent in low dielectric constant and other electrical characteristics has been sought for these resin materials as well.

To deal with such demands, for example, Patent Document 1 discloses a radiation-sensitive resin composition which contains an alicyclic olefin polymer which has an acidic group and a compound which has two or more functional groups able to react with the acidic group, an onium salt, and an antioxidant in 3 to 15 parts by weight with respect to 100 parts by weight of the polymer. Note that, this Patent Document 1 discloses an example of use, as the compound which has two or more functional groups able to react with the acidic group, of compounds which have two or more epoxy groups or oxetanyl groups. According to the radiation-sensitive resin composition of this Patent Document 1, while it is possible to obtain a resin film which is little in fluctuation of thickness and maintains its transparency even under long term high temperature heating conditions, the obtained resin film is not necessarily sufficient in low corrosiveness to the metal material which is used for the interconnects etc. For this reason, improvement of the low corrosiveness to metal materials has been desired.

PRIOR ART DOCUMENTS

Patent Documents

Patent Document 1: Japanese Patent Publication No. 2006-265322A

SUMMARY OF THE INVENTION

Technical Problem

The present invention has as its object the provision of a radiation-sensitive resin composition which can give a resin film which is high in exposure sensitivity, has a high transparency even after baking in an oxidizing atmosphere, and is excellent in low corrosiveness to metal and an electronic device provided with a resin film which is comprised of such a radiation-sensitive resin composition.

Solution to Problem

The inventors engaged in intensive research for achieving the above objects and as a result discovered that the above objects can be achieved by a radiation-sensitive resin composition which contains an alicyclic olefin polymer which has an acidic group, a specific sulfonium salt-based photoacid generator, and a cross-linking agent and thereby completed the present invention.

That is, according to one aspect of the present invention,
[1] A radiation-sensitive resin composition which contains an alicyclic olefin polymer which has an acidic group (A), sulfonium salt-based photoacid generator (B) which is represented by the following general formula (1), and a cross-linking agent (C).

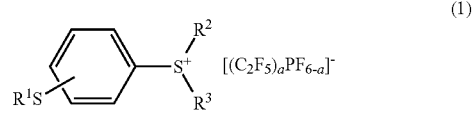

(In the above general formula (1), $R^1$, $R^2$, and $R^3$ respectively independently are a $C_6$ to $C_{30}$ aryl group, $C_4$ to $C_{30}$ heterocyclic group, $C_1$ to $C_{30}$ alkyl group, $C_2$ to $C_{30}$ alkenyl group, or $C_2$ to $C_{30}$ alkynyl group, the groups being optionally substituted, and "a" is an integer of 1 to 5),
[2] The radiation-sensitive resin composition according to [1], wherein in the general formula (1), $R^1$, $R^2$, and $R^3$ are $C_6$ to $C_{30}$ aryl groups,
[3] The radiation-sensitive resin composition according to [2], wherein in the general formula (1), $R^1$, $R^2$, and $R^3$ are phenyl groups,
[4] The radiation-sensitive resin composition according to any one of [1] to [3], wherein in the general formula (1), "a" is 3,
[5] The radiation-sensitive resin composition according to any one of [1] to [4], further containing an antioxidant (D),
[6] The radiation-sensitive resin composition according to any one of [1] to [5], wherein a ratio of content of the sulfonium salt-based photoacid generator (B) is 1 to 15 parts by weight with respect to 100 parts by weight of the alicyclic olefin polymer which has an acidic group (A),

[7] The radiation-sensitive resin composition according to any one of [1] to [6], wherein the cross-linking agent (C) is a compound which has two or more epoxy groups,
[8] The radiation-sensitive resin composition according to any one of [1] to [7], wherein the cross-linking agent (C) is a compound which has two or more oxetanyl groups,
[9] The radiation-sensitive resin composition according to [7] or [8], wherein the cross-linking agent (C) is a combination of a compound which has two or more epoxy groups and a compound which has two or more oxetanyl groups.
[10] An electronic device which is provided with a resin film comprised of a radiation-sensitive resin composition according to any one of [1] to [9].

Advantageous Effects

According to one aspect of the present invention, it is possible to provide a radiation-sensitive resin composition which can give a resin film which is high in exposure sensitivity, has a high transparency even after baking in an oxidizing atmosphere, and is excellent in low corrosiveness to metal and an electronic device which is provided with a resin film which is comprised of such a radiation-sensitive resin composition.

DESCRIPTION OF EMBODIMENTS

The radiation-sensitive resin composition of one embodiment of the present invention comprises an alicyclic olefin polymer which has an acidic group (A), a sulfonium salt-based photoacid generator (B) which is represented by the later explained general formula (1), and a cross-linking agent (C).

(Alicyclic Olefin Polymer which has Acidic Group (A))

As the alicyclic olefin polymer which has an acidic group (A) (below, simply referred to as "alicyclic olefin polymer (A)"), a polymer of one or more cyclic olefin monomers or a copolymer of one or more cyclic olefin monomers and a monomer which is copolymerizable with the same may be mentioned, but in one embodiment of the present invention, as the monomer for forming the alicyclic olefin polymer (A), at least a cyclic olefin monomer which has an acidic group (a) is preferably used.

As specific examples of the cyclic olefin monomer which has an acidic group (a) (below, suitably called the "monomer (a)"), 2-hydroxycarbonylbicyclo[2.2.1]hept-5-ene, 2-methyl-2-hydroxycarbonylbicyclo[2.2.1]hept-5-ene, 2-carboxymethyl-2-hydroxycarbonylbicyclo[2.2.1]hept-5-ene, 2-hydroxycarbonyl-2-methoxycarbonylmethylbicyclo[2.2.1]hept-5-ene, 2-hydroxycarbonyl-2-ethoxycarbonylmethylbicyclo[2.2.1]hept-5-ene, 2-hydroxycarbonyl-2-propoxycarbonylmethylbicyclo[2.2.1]hept-5-ene, 2-hydroxycarbonyl-2-butoxycarbonylmethylbicyclo[2.2.1]hept-5-ene, 2-hydroxycarbonyl-2-pentyloxycarbonylmethylbicyclo[2.2.1]hept-5-ene, 2-hydroxycarbonyl-2-hexyloxycarbonylmethylbicyclo[2.2.1]hept-5-ene, 2-hydroxycarbonyl-2-cyclohexyloxycarbonylmethylbicyclo[2.2.1]hept-5-ene, 2-hydroxycarbonyl-2-phenoxycarbonylmethylbicyclo[2.2.1]hept-5-ene, 2-hydroxycarbonyl-2-naphthyloxycarbonylmethylbicyclo[2.2.1]hept-5-ene, 2-hydroxycarbonyl-2-biphenyloxycarbonylmethylbicyclo[2.2.1]hept-5-ene, 2-hydroxycarbonyl-2-benzyloxycarbonylmethylbicyclo[2.2.1]hept-5-ene, 2-hydroxycarbonyl-2-hydroxyethoxycarbonylmethylbicyclo[2.2.1]hept-5-ene, 2,3-dihydroxycarbonylbicyclo[2.2.1]hept-5-ene, 2-hydroxycarbonyl-3-methoxycarbonylbicyclo[2.2.1]hept-5-ene, 2-hydroxycarbonyl-3-ethoxycarbonylbicyclo[2.2.1]hept-5-ene, 2-hydroxycarbonyl-3-propoxycarbonylbicyclo[2.2.1]hept-5-ene, 2-hydroxycarbonyl-3-butoxycarbonylbicyclo[2.2.1]hept-5-ene, 2-hydroxycarbonyl-3-pentyloxycarbonylbicyclo[2.2.1]hept-5-ene, 2-hydroxycarbonyl-3-hexyloxycarbonylbicyclo[2.2.1]hept-5-ene, 2-hydroxycarbonyl-3-cyclohexyloxycarbonylbicyclo[2.2.1]hept-5-ene, 2-hydroxycarbonyl-3-phenoxycarbonylbicyclo[2.2.1]hept-5-ene, 2-hydroxycarbonyl-3-naphthyloxycarbonylbicyclo[2.2.1]hept-5-ene, 2-hydroxycarbonyl-3-biphenyloxycarbonylbicyclo[2.2.1]hept-5-ene, 2-hydroxycarbonyl-3-benzyloxycarbonylbicyclo[2.2.1]hept-5-ene, 2-hydroxycarbonyl-3-hydroxyethoxycarbonylbicyclo[2.2.1]hept-5-ene, 2-hydroxycarbonyl-3-hydroxycarbonylmethylbicyclo[2.2.1]hept-5-ene, 3-methyl-2-hydroxycarbonylbicyclo[2.2.1]hept-5-ene, 3-hydroxymethyl-2-hydroxycarbonylbicyclo[2.2.1]hept-5-ene, 2-hydroxycarbonyltricyclo[5.2.1.0$^{2,6}$]deca-3,8-diene, 4-hydroxycarbonyltetracyclo[6.2.1.1$^{3,6}$.0$^{2,7}$]dodec-9-ene, 4-methyl-4-hydroxycarbonyltetracyclo[6.2.1.1$^{3,6}$.0$^{2,7}$]dodec-9-ene, 4,5-dihydroxycarbonyltetracyclo[6.2.1.1$^{3,6}$.0$^{2,7}$]dodec-9-ene, 4-carboxymethyl-4-hydroxycarbonyltetracyclo[6.2.1.1$^{3,6}$.0$^{2,7}$]dodec-9-ene, N-(hydroxycarbonylmethyl)bicyclo[2.2.1]hept-5-ene-2,3-dicarboxyimide, N-(hydroxycarbonylethyl)bicyclo[2.2.1]hept-5-ene-2,3-dicarboxyimide, N-(hydroxycarbonylpentyl)bicyclo[2.2.1]hept-5-ene-2,3-dicarboxyimide, N-(dihydroxycarbonylethyl)bicyclo[2.2.1]hept-5-ene-2,3-dicarboxyimide, N-(dihydroxycarbonylpropyl)bicyclo[2.2.1]hept-5-ene-2,3-dicarboxyimide, N-(hydroxycarbonylphenethyl)bicyclo[2.2.1]hept-5-ene-2,3-dicarboxyimide, N-(2-(4-hydroxyphenyl)-1-(hydroxycarbonyl)ethyl)bicyclo[2.2.1]hept-5-ene-2,3-dicarboxyimide, N-(hydroxycarbonylphenyl)bicyclo[2.2.1]hept-5-ene-2,3-dicarboxyimide, and other carboxy group-containing cyclic olefins; 2-(4-hydroxyphenyl)bicyclo[2.2.2]hept-5-ene, 2-methyl-2-(4-hydroxyphenyl)bicyclo[2.2.1]hept-5-ene, 4-(4-hydroxyphenyl)tetracyclo[6.2.1.1$^{3,6}$.0$^{2,7}$]dodec-9-ene, 4-methyl-4-(4-hydroxyphenyl)tetracyclo[6.2.1.1$^{3,6}$.0$^{2,7}$]dodec-9-ene, 2-hydroxybicyclo[2.2.1]hept-5-ene, 2-hydroxymethylbicyclo[2.2.1]hept-5-ene, 2-hydroxyethylbicyclo[2.2.1]hept-5-ene, 2-methyl-2-hydroxymethylbicyclo[2.2.1]hept-5-ene, 2,3-dihydroxymethylbicyclo[2.2.1]hept-5-ene, 2-(hydroxyethoxycarbonyl)bicyclo[2.2.1]hept-5-ene, 2-methyl-2-(hydroxyethoxycarbonyl)bicyclo[2.2.1]hept-5-ene, 2-(1-hydroxy-1-trifluoromethyl-2,2,2-trifluoroethyl)bicyclo[2.2.1]hept-5-ene, 2-(2-hydroxy-2-trifluoromethyl-3,3,3-trifluoropropyl)bicyclo[2.2.1]hept-5-ene, 3-hydroxytricyclo[5.2.1.0$^{2,6}$]deca-4,8-diene, 3-hydroxymethyltricyclo[5.2.1.0$^{2,6}$]deca-4,8-diene, 4-hydroxytetracyclo[6.2.1.1$^{3,6}$.0$^{2,7}$]dodec-9-ene, 4-hydroxymethyltetracyclo[6.2.1.1$^{3,6}$.0$^{2,7}$]dodec-9-ene, 4,5-dihydroxymethyltetracyclo[6.2.1.1$^{3,6}$.0$^{2,7}$]dodec-9-ene, 4-(hydroxyethoxycarbonyl)tetracyclo[6.2.1.1$^{3,6}$.0$^{2,7}$]dodec-9-ene, 4-methyl-4-(hydroxyethoxycarbonyl)tetracyclo[6.2.1.1$^{3,6}$.0$^{2,7}$]dodec-9-ene, N-(hydroxyethyl)bicyclo[2.2.1]hept-5-ene-2,3-dicarboxyimide, N-(hydroxyphenyl)bicyclo[2.2.1]hept-5-ene-2,3-dicarboxyimide, and other hydroxyl group-containing cyclic olefins etc. may be mentioned. Among these as well, from the viewpoint of the adhesion of the obtained resin film becoming higher, carboxy group-containing cyclic olefins are preferable, while 4-hydroxycarbonyltetracyclo[6.2.1.1$^{3,6}$.0$^{2,7}$]dodec-9-ene is particularly preferable. These monomers (a) may respectively be used alone or may be used as two types or more combined.

In the alicyclic olefin polymer (A), the ratio of content of the units of the monomer (a) is preferably 10 to 90 mol % with respect to all monomer units. By the ratio of content of the units of the monomer (a) being in this range, the radiation-sensitive resin composition of one embodiment of the present invention can be improved in radiation sensitivity, formation of undissolved residue at the time of development, and solubility in a polar solvent with a good balance.

Further, the alicyclic olefin polymer (A) used in one embodiment of the present invention may be a copolymer which is obtained by copolymerization of the cyclic olefin monomer which has an acidic group (a) and a monomer (b) which can copolymerize with this. As such a copolymerizable monomer, a cyclic olefin monomer which has a polar group other than an acidic group (b1), a cyclic olefin monomer which does not have a polar group (b2), and a monomer other than a cyclic olefin (b3) (below, suitably called the "monomer (b1)", "monomer (b2)", and "monomer (b3)") may be mentioned.

As the cyclic olefin monomer which has a polar group other than an acidic group (b1), for example, a cyclic olefin which has an N-substituted imide group, ester group, cyano group, acid anhydride group, or halogen atom may be mentioned.

As a cyclic olefin which has an N-substituted imide group, for example, a monomer represented by the following general formula (2) or a monomer represented by the following general formula (3) may be mentioned.

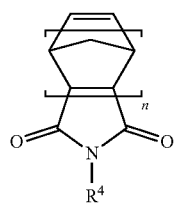

(2)

(In the above general formula (2), $R^4$ indicates a hydrogen atom or $C_1$ to $C_{16}$ alkyl group or aryl group. "n" indicates an integer of 1 to 2.)

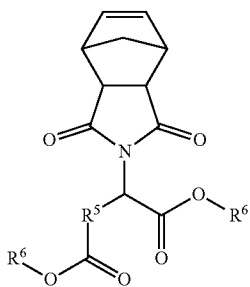

(3)

(In the above general formula (3), $R^5$ indicates a $C_1$ to $C_3$ bivalent alkylene group, while $R^6$ indicates a $C_1$ to $C_{10}$ monovalent alkyl group or a $C_1$ to $C_{10}$ monovalent halogenated alkyl group.)

In the above formula (2), $R^5$ is a $C_1$ to $C_{16}$ alkyl group or aryl group. As specific examples of the alkyl group, a methyl group, ethyl group, n-propyl group, n-butyl group, n-pentyl group, n-hexyl group, n-heptyl group, n-octyl group, n-nonyl group, n-decyl group, n-undecyl group, n-dodecyl group, n-tridecyl group, n-tetradecyl group, n-pentadecyl group, n-hexadecyl group, and other straight chain alkyl groups; cyclopropyl group, cyclobutyl group, cyclopentyl group, cyclohexyl group, cycloheptyl group, cyclooctyl group, cyclononyl group, cyclodecyl group, cycloundecyl group, cyclododecyl group, norbornyl group, bornyl group, isobornyl group, decahydronaphthyl group, tricyclodecanyl group, adamantyl group, and other cyclic alkyl groups; 2-propyl group, 2-butyl group, 2-methyl-1-propyl group, 2-methyl-2-propyl group, 1-methylbutyl group, 2-methylbutyl group, 1-methylpentyl group, 1-ethylbutyl group, 2-methylhexyl group, 2-ethylhexyl group, 4-methylheptyl group, 1-methylnonyl group, 1-methyltridecyl group, 1-methyltetradecyl group, and other branched alkyl groups; etc. may be mentioned. Further, as specific examples of the aryl group, a benzyl group etc. may be mentioned. Among these as well, due to the more excellent heat resistance and solubility in a polar solvent, a $C_6$ to $C_{14}$ alkyl group and aryl group are preferable, while a $C_6$ to $C_{10}$ alkyl group and aryl group are more preferable. If the number of carbon atoms is 4 or less, the solubility in a polar solvent is inferior, while if the number of carbon atoms is 17 or more, the heat resistance is inferior. Further, when patterning the resin film, there is the problem that the resin film melts by heat and the patterns to end up disappearing.

As specific examples of the monomer represented by the above general formula (2), bicyclo[2.2.1]hept-5-ene-2,3-dicarboxyimide, N-phenyl-bicyclo[2.2.1]hept-5-ene-2,3-dicarboxyimide, N-methylbicyclo[2.2.1]hept-5-ene-2,3-dicarboxyimide, N-ethylbicyclo[2.2.1]hept-5-ene-2,3-dicarboxyimide, N-propylbicyclo[2.2.1]hept-5-ene-2,3-dicarboxyimide, N-butylbicyclo[2.2.1]hept-5-ene-2,3-dicarboxyimide, N-cyclohexylbicyclo[2.2.1]hept-5-ene-2,3-dicarboxyimide, N-adamantylbicyclo[2.2.1]hept-5-ene-2,3-dicarboxyimide, N-(1-methylbutyl)-bicyclo[2.2.1]hept-5-ene-2,3-dicarboxyimide, N-(2-methylbutyl)-bicyclo[2.2.1]hept-5-ene-2,3-dicarboxyimide, N-(1-methylpentyl)-bicyclo[2.2.1]hept-5-ene-2,3-dicarboxyimide, N-(2-methylpentyl)-bicyclo[2.2.1]hept-5-ene-2,3-dicarboxyimide, N-(1-ethylbutyl)-bicyclo[2.2.1]hept-5-ene-2,3-dicarboxyimide, N-(2-ethylbutyl)-bicyclo[2.2.1]hept-5-ene-2,3-dicarboxyimide, N-(1-methylhexyl)-bicyclo[2.2.1]hept-5-ene-2,3-dicarboxyimide, N-(2-methylhexyl)-bicyclo[2.2.1]hept-5-ene-2,3-dicarboxyimide, N-(3-methylhexyl)-bicyclo[2.2.1]hept-5-ene-2,3-dicarboxyimide, N-(1-butylpentyl)-bicyclo[2.2.1]hept-5-ene-2,3-dicarboxyimide, N-(2-butylpentyl)-bicyclo[2.2.1]hept-5-ene-2,3-dicarboxyimide, N-(1-methylheptyl)-bicyclo[2.2.1]hept-5-ene-2,3-dicarboxyimide, N-(2-methylheptyl)-bicyclo[2.2.1]hept-5-ene-2,3-dicarboxyimide, N-(3-methylheptyl)-bicyclo[2.2.1]hept-5-ene-2,3-dicarboxyimide, N-(4-methylheptyl)-bicyclo[2.2.1]hept-5-ene-2,3-dicarboxyimide, N-(1-ethylhexyl)-bicyclo[2.2.1]hept-5-ene-2,3-dicarboxyimide, N-(2-ethylhexyl)-bicyclo[2.2.1]hept-5-ene-2,3-dicarboxyimide, N-(3-ethylhexyl)-bicyclo[2.2.1]hept-5-ene-2,3-dicarboxyimide, N-(1-propylpentyl)-bicyclo[2.2.1]hept-5-ene-2,3-dicarboxyimide, N-(2-propylpentyl)-bicyclo[2.2.1]hept-5-ene-2,3-dicarboxyimide, N-(1-methyloctyl)-bicyclo[2.2.1]hept-5-ene-2,3-dicarboxyimide, N-(2-methyloctyl)-bicyclo[2.2.1]hept-5-ene-2,3-dicarboxyimide, N-(3-methyloctyl)-bicyclo[2.2.1]hept-5-ene-2,3-dicarboxyimide, N-(4-methyloctyl)-bicyclo[2.2.1]hept-5-ene-2,3-dicarboxyimide, N-(1-ethylheptyl)-bicyclo[2.2.1]hept-5-ene-2,3-dicarboxyimide, N-(2-ethylheptyl)-bicyclo[2.2.1]hept-5-ene-2,3-dicarboxyimide, N-(3-ethylheptyl)-bicyclo[2.2.1]hept-5-ene-2,3-dicarboxyimide, N-(4-ethylheptyl)-bicyclo[2.2.1]hept-5-ene-2,3-dicarboxyimide, N-(1-propylhexyl)-bicyclo[2.2.1]hept-5-ene-2,3-dicarboxyimide, N-(2-propylhexyl)-bicyclo[2.2.1]hept-5-ene-2,3-dicarboxyimide, N-(3- propylhexyl)-bicyclo[2.2.1]hept-5-ene-2,3-dicarboxyimide, N-(1-methylnonyl)-bicyclo[2.2.1]hept-5-ene-2,3-dicarboxyimide, N-(2-methylnonyl)-bicyclo[2.2.1]hept-5-ene-2,3-dicarboxyimide, N-(3-methylnonyl)-bicyclo[2.2.1]hept-5-ene-2,3-dicarboxyimide, N-(4-methylnonyl)-bicyclo[2.2.1]hept-5-ene-2,3-dicarboxyimide, N-(5-methylnonyl)-bicyclo[2.2.1]hept-5-ene-2,3-dicarboxyimide, N-(1-ethyloctyl)-bicyclo[2.2.1]hept-5-ene-2,3-dicarboxyimide, N-(2-ethyloctyl)-bicyclo[2.2.1]hept-5-ene-2,3-dicarboxyimide, N-(3-ethyloctyl)-bicyclo[2.2.1]hept-5-ene-2,3-dicarboxyimide, N-(4-ethyloctyl)-bicyclo[2.2.1]hept-5-ene-2,3-dicarboxyimide, N-(1-methyldecyl)-bicyclo[2.2.1]hept-5-ene-2,3-dicarboxyimide, N-(1-methyldodecyl)-bicyclo[2.2.1]hept-5-ene-2,3-dicarboxyimide, N-(1-methylundecyl)-bicyclo[2.2.1]hept-5-ene-2,3-dicarboxyimide, N-(1-methyldodecyl)-bicyclo[2.2.1]hept-5-ene-2,3-dicarboxyimide, N-(1-methyltridecyl)-bicyclo[2.2.1]hept-5-ene-2,3-dicarboxyimide, N-(1-methyltetradecyl)-bicyclo[2.2.1]hept-5-ene-2,3-dicarboxyimide, N-(1-methylpentadecyl)-bicyclo[2.2.1]hept-5-ene-2,3-dicarboxyimide, N-phenyl-tetracyclo[6.2.1.1$^{3,6}$.0$^{2,7}$]dodec-9-ene-4,5-dicarboxyimide, N-(2,4-dimethoxyphenyl)-tetracyclo[6.2.1.1$^{3,6}$.0$^{2,7}$]dodec-9-ene-4,5-dicarboxyimide, etc. may be mentioned. Note that, these may respectively be used alone or may be used as two types or more combined.

On the other hand, in the above general formula (3), $R^5$ is a $C_1$ to $C_3$ bivalent alkylene group. As the $C_1$ to $C_3$ bivalent alkylene group, a methylene group, ethylene group, propylene group, and isopropylene group may be mentioned. Among these as well, due to the excellent polymerization activity, a methylene group and ethylene group are preferable.

Further, in the above general formula (3), $R^6$ is a $C_1$ to $C_{10}$ monovalent alkyl group or $C_1$ to $C_{10}$ monovalent halogenated alkyl group. As the $C_1$ to $C_{10}$ monovalent alkyl group, for example, a methyl group, ethyl group, propyl group, isopropyl group, butyl group, sec-butyl group, tert-butyl group, hexyl group, cyclohexyl group, etc. may be mentioned. As the $C_1$ to $C_{10}$ monovalent halogenated alkyl group, for example, a fluoromethyl group, chlormethyl group, bromoethyl group, difluoromethyl group, dichloromethyl group, difluoromethyl group, trifluoromethyl group, trichloromethyl group, 2,2,2-trifluoroethyl group, pentafluoroethyl group, heptafluoropropyl group, perfluorobutyl group, perfluoropentyl group, etc. may be mentioned. Among these as well, since the solubility in a polar solvent is excellent, as $R^6$, a methyl group or ethyl group is preferable.

Note that, the monomer represented by the above general formulas (2) and (3) can, for example, be obtained by an imidization reaction between a corresponding amine and 5-norbornene-2,3-dicarboxylic acid anhydride. Further, the obtained monomer can be efficiently isolated by separating and refining the reaction solution of the imidization reaction by a known method.

As the cyclic olefin which has an ester group, for example, 2-acetoxybicyclo[2.2.1]hept-5-ene, 2-acetoxymethylbicyclo[2.2.1]hept-5-ene, 2-methoxycarbonylbicyclo[2.2.1]hept-5-ene, 2-ethoxycarbonylbicyclo[2.2.1]hept-5-ene, 2-propoxycarbonylbicyclo[2.2.1]hept-5-ene, 2-butoxycarbonylbicyclo[2.2.1]hept-5-ene, 2-cyclohexyloxycarbonylbicyclo[2.2.1]hept-5-ene, 2-methyl-2-methoxycarbonylbicyclo[2.2.1]hept-5-ene, 2-methyl-2-ethoxycarbonylbicyclo[2.2.1]hept-5-ene, 2-methyl-2-propoxycarbonylbicyclo[2.2.1]hept-5-ene, 2-methyl-2-butoxycarbonylbicyclo[2.2.1]hept-5-ene, 2-methyl-2-cyclohexyloxycarbonylbicyclo[2.2.1]hept-5-ene, 2-(2,2,2-trifluoroethoxycarbonyl)bicyclo[2.2.1]hept-5-ene, 2-methyl-2-(2,2,2-trifluoroethoxycarbonyl)bicyclo[2.2.1]hept-5-ene, 2-methoxycarbonyltricyclo[5.2.1.0$^{2,6}$]dec-8-ene, 2-ethoxycarbonyltricyclo[5.2.1.0$^{2,6}$]dec-8-ene, 2-propoxycarbonyltricyclo[5.2.1.0$^{2,6}$]dec-8-ene, 4-acetoxytetracyclo[6.2.1.1$^{3,6}$.0$^{2,7}$]dodec-9-ene, 4-methoxycarbonyltetracyclo[6.2.1.1$^{3,6}$.0$^{2,7}$]dodec-9-ene, 4-ethoxycarbonyltetracyclo[6.2.1.1$^{3,6}$.0$^{2,7}$]dodec-9-ene, 4-propoxycarbonyltetracyclo[6.2.1.1$^{3,6}$.0$^{2,7}$]dodec-9-ene, 4-butoxycarbonyltetracyclo[6.2.1.1$^{3,6}$.0$^{2,7}$]dodec-9-ene, 4-methyl-4-methoxycarbonyltetracyclo[6.2.1.1$^{3,6}$.0$^{2,7}$]dodec-9-ene, 4-methyl-4-ethoxycarbonyltetracyclo[6.2.1.1$^{3,6}$.0$^{2,7}$]dodec-9-ene, 4-methyl-4-propoxycarbonyltetracyclo[6.2.1.1$^{3,6}$.0$^{2,7}$]dodec-9-ene, 4-methyl-4-butoxycarbonyltetracyclo[6.2.1.1$^{3,6}$.0$^{2,7}$]dodec-9-ene, 4-(2,2,2-trifluoroethoxycarbonyl)tetracyclo[6.2.1.1$^{3,6}$.0$^{2,7}$]dodec-9-ene, 4-methyl-4-(2,2,2-trifluoroethoxycarbonyl)tetracyclo[6.2.1.1$^{3,6}$.0$^{2,7}$]dodec-9-ene, etc. may be mentioned.

As the cyclic olefin which has a cyano group, for example, 4-cyanotetracyclo[6.2.1.1$^{3,6}$.0$^{2,7}$]dodec-9-ene, 4-methyl-4-cyanotetracyclo[6.2.1.1$^{3,6}$.0$^{2,7}$]dodec-9-ene, 4,5-dicyanotetracyclo[6.2.1.1$^{3,6}$.0$^{2,7}$]dodec-9-ene, 2-cyanobicyclo[2.2.1]hept-5-ene, 2-methyl-2-cyanobicyclo[2.2.1]hept-5-ene, 2,3-dicyanobicyclo[2.2.1]hept-5-ene, etc. may be mentioned.

As the cyclic olefin which has an acid anhydride group, for example, tetracyclo[6.2.1.1$^{3,6}$.0$^{2,7}$]dodec-9-ene-4,5-dicarboxylic anhydride, bicyclo[2.2.1]hept-5-ene-2,3-dicarboxylic anhydride, 2-carboxymethyl-2-hydroxycarbonylbicyclo[2.2.1]hept-5-ene anhydride, etc. may be mentioned.

As the cyclic olefin which has a halogen atom, for example, 2-chlorobicyclo[2.2.1]hept-5-ene, 2-chloromethylbicyclo[2.2.1]hept-5-ene, 2-(chlorophenyl)bicyclo[2.2.1]hept-5-ene, 4-chlorotetracyclo[6.2.1.1$^{3,6}$.0$^{2,7}$]dodec-9-ene, 4-methyl-4-chlorotetracyclo[6.2.1.1$^{3,6}$.0$^{2,7}$]dodec-9-ene, etc. may be mentioned.

These monomers (b1) may respectively be used alone or may be used as two types or more combined.

As the cyclic olefin monomer which does not have a polar group (b2), bicyclo[2.2.1]hept-2-ene (also called "norbornene"), 5-ethylbicyclo[2.2.1]hept-2-ene, 5-butyl-bicyclo[2.2.1]hept-2-ene, 5-ethylidene-bicyclo[2.2.1]hept-2-ene, 5-methylidene-bicyclo[2.2.1]hept-2-ene, 5-vinyl-bicyclo[2.2.1]hept-2-ene, tricyclo[5.2.1.0$^{2,6}$]deca-3,8-diene (common name: dicyclopentadiene), tetracyclo[10.2.1.0$^{2,11}$.0$^{4,9}$]pentadec-4,6,8,13-tetraene, tetracyclo[6.2.1.1$^{3,6}$.0$^{2,7}$]dodec-4-ene (also called "tetracyclododecene"), 9-methyl-tetracyclo[6.2.1.1$^{3,6}$.0$^{2,7}$]dodec-4-ene, 9-ethyl-tetracyclo[6.2.1.1$^{3,6}$.0$^{2,7}$]dodec-4-ene, 9-methylidene-tetracyclo[6.2.1.1$^{3,6}$.0$^{2,7}$]dodec-4-ene, 9-ethylidene-tetracyclo[6.2.1.1$^{3,6}$.0$^{2,7}$]dodec-4-ene, 9-vinyl-tetracyclo[6.2.1.1$^{3,6}$.0$^{2,7}$]dodec-4-ene, 9-propenyl-tetracyclo[6.2.1.1$^{3,6}$.0$^{2,7}$]dodec-4-ene, pentacyclo[9.2.1.1$^{3,9}$.0$^{2,10}$.0$^{4,8}$]pentadeca-5,12-diene, cyclobutene, cyclopentene, cyclopentadiene, cyclohexene, cycloheptene, cyclooctene, cyclooctadiene, indene, 3a,5,6,7a-tetrahydro-4,7-methano-1H-indene, 9-phenyl-tetracyclo[6.2.1.1$^{3,6}$.0$^{2,7}$]dodec-4-ene, tetracyclo[9.2.1.0$^{2,10}$.0$^{3,8}$]tetradec-3,5, 7, 12-tetraene, pentacyclo[9.2.1.1$^{3,9}$.0$^{2,10}$.0$^{4,8}$]pentadec-12-ene, etc. may be mentioned. These monomers (b2) may respectively be used alone or may be used as two types or more combined.

As specific examples of the monomer other than a cyclic olefin (b3), ethylene; propylene, 1-butene, 1-pentene, 1-hexene, 3-methyl-1-butene, 3-methyl-1-pentene, 3-ethyl-1-pentene, 4-methyl-1-pentene, 4-methyl-1-hexene, 4,4-dimethyl-1-hexene, 4,4-dimethyl-1-pentene, 4-ethyl-1-hexene, 3-ethyl-1-hexene, 1-octene, 1-decene, 1-dodecene, 1-tetradecene, 1-hexadecene, 1-octadecene, 1-eicosene, and other $C_2$ to $C_{20}$ α-olefins; 1,4-hexadiene, 1,5-hexadiene, 4-methyl-1,4-hexadiene, 5-methyl-1,4-hexadiene, 1,7-octadiene, and other nonconjugated dienes and their derivatives; etc. may be mentioned. Among these as well, α-olefin is preferable. These monomers (b3) may respectively be used alone or may be used as two types or more combined.

Among these monomers (b1) to (b3) as well, from the viewpoint of the effect of the embodiment of the present invention becoming more remarkable, a cyclic olefin monomer which has a polar group other than a protonic polar group (b1) is preferable, while a cyclic olefin which has an N-substituted imide group is particularly preferable.

In the alicyclic olefin polymer (A), the ratio of content of units of the copolymerizable monomer (b) is preferably 10 to 90 mol % with respect to the total monomer units. If the ratio of content of the units of the copolymerizable monomer (b) is too small, the alicyclic olefin polymer (A) is liable to become insufficient in solubility in a polar solvent, while if too great, the radiation-sensitive resin composition of one embodiment of the present invention is liable to become insufficient in radiation sensitivity and undissolved residue is liable to be formed at the time of development.

Note that, in one embodiment of the present invention, it is also possible to introduce an acidic group in a cyclic olefin-based polymer which does not have an acidic group utilizing a known modifying agent so as to obtain the alicyclic olefin polymer (A). The polymer which does not have an acidic group can be obtained by polymerizing at least one of the above-mentioned monomers (b1) and (b2) and, in accordance with need, a monomer (b3) in any combination.

Note that, the alicyclic olefin polymer (A) used in one embodiment of the present invention may be a ring-opened polymer obtained by ring-opening polymerization of the above-mentioned monomers or may be an addition polymer obtained by addition polymerization of the above-mentioned monomers, but from the viewpoint of the effect of one embodiment of the present invention becoming more remarkable, a ring-opened polymer is preferable.

A ring-opened polymer can be produced by ring-opening methathesis polymerization of a cyclic olefin monomer which has an acidic group (a) and a copolymerizable monomer (b) used according to need in the presence of a methathesis reaction catalyst. As the method of production, for example, the method described in International Publication No. 2010/110323A, [0039] to [0079], etc. can be used. On the other hand, an addition polymer can be obtained by causing polymerization of a cyclic olefin monomer which has an acidic group (a) and a copolymerizable monomer (b) used according to need using a known additional polymerization catalyst, for example, a catalyst comprised of a compound of titanium, zirconium, or vanadium and an organic aluminum compound.

Further, when the alicyclic olefin polymer (A) used in one embodiment of the present invention is a ring-opened polymer, it is preferable to further perform a hydrogenation reaction and obtain a hydrogenated product in which the carbon-carbon double bonds which are contained in the main chain are hydrogenated. When the alicyclic olefin polymer (A) is a hydrogenated product, the ratio of the hydrogenated carbon-carbon double bonds (hydrogenation rate) is usually 50% or more. From the viewpoint of the heat resistance, 70% or more is preferable, 90% or more is more preferable, and 95% or more is furthermore preferable.

Further, the acid value of the alicyclic olefin polymer (A) used in one embodiment of the present invention is not particularly limited, but is preferably 50 to 250 mgKOH/g, more preferably 70 to 200 mgKOH/g.

The alicyclic olefin polymer (A) used in one embodiment of the present invention has a weight average molecular weight (Mw) of usually 1,000 to 1,000,000, preferably 1,500 to 100,000, more preferably 2,000 to 10,000 in range.

Further, the alicyclic olefin polymer (A) has a molecular weight distribution of a weight average molecular weight/number average molecular weight (Mw/Mn) ratio of usually 4 or less, preferably 3 or less, more preferably 2.5 or less.

The weight average molecular weight (Mw) and molecular weight distribution (Mw/Mn) of the alicyclic olefin polymer (A) are values which are found by gel permeation chromotography (GFC) using tetrahydrofuran and other solvents as eluents and as values converted to polystyrene.

(Sulfonium Salt-Based Photoacid Generator (B))

The radiation-sensitive resin composition of one embodiment of the present invention contains a sulfonium salt-based photoacid generator (B) which is represented by the following general formula (1). The sulfonium salt-based photoacid generator (B) which is represented by the following general formula (1) (below, simply referred to as the "sulfonium salt-based photoacid generator (B)") is a sulfonium salt-based compound which reacts to light to generate a Bronsted acid or Lewis acid and acts as a photosensitizer, specifically a negative type photosensitizer. For this reason, the radiation-sensitive resin composition of one embodiment of the present invention normally acts as a negative type radiation-sensitive resin composition.

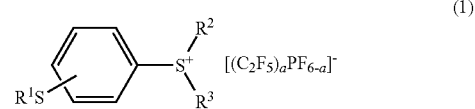

(1)

In the above general formula (1), $R^1$, $R^2$, and $R^3$ are respectively independently a $C_6$ to $C_{30}$ aryl group, $C_4$ to $C_{30}$ heterocyclic group, $C_1$ to $C_{30}$ alkyl group, $C_2$ to $C_{30}$ alkenyl group, or $C_2$ to $C_{30}$ alkynyl group, these groups may have a substituent. Note that, as the substituent, for example, an alkyl group, hydroxy group, alkoxy group, alkylcarbonyl group, arylcarbonyl group, alkoxycarbonyl group, aryloxycarbonyl group, arylthiocarbonyl group, acyloxy group, arylthio group, alkylthio group, aryl group, heterocyclic group, aryloxy group, alkylsulfinyl group, arylsulfinyl group, alkylsulfonyl group, arylsulfonyl group, alkyleneoxy group, amino group, cyano group, nitro group, halogen atom, etc. may be mentioned.

As the $C_6$ to $C_3$, aryl group, a phenyl group or other monocyclic aryl group; naphthyl group, anthracenyl group, phenanthrenyl group, pyrenyl group, chrysenyl group, naphthacenyl group, benzoanthracenyl group, anthraquinolyl group, fluororenyl group, naphthoquinolyl group, or other condensed polycyclic aryl group may be mentioned.

As the $C_4$ to $C_{30}$ heterocyclic group, a cyclic one including one to three oxygens, nitrogens, sulfurs, or other hetero atoms may be mentioned. As specific examples, a thienyl group, furanyl group, pyranyl group, pyrrolyl group, oxazolyl group, thiazolyl group, pyridyl group, pyrimidyl group, pyradinyl group, or other monocyclic heterocyclic groups; indolyl group, benzofuranyl group, isobenzofuranyl group, benzothienyl group, isobenzothienyl group, quinolyl group, isoquinolyl group, quinoxalinyl group, quinazolinyl group, carbazolyl group, acridinyl group, phenothiazinyl group, phenazinyl group, xanthenyl group, thianthrenyl group, phenoxazinyl group, phenoxathiinyl group, chromanyl group, isochromanyl group, dibenzothienyl group, fenoxanil group, thioxantonyl group, dibenzofuranyl group, or other condensed polycyclic heterocyclic group; etc. may be mentioned.

As the $C_1$ to $C_{30}$ alkyl group, a methyl group, ethyl group, propyl group, butyl group, pentyl group, octyl group, decyl group, dodecyl group, tetradecyl group, hexadecyl group, octadecyl group, or other straight chain alkyl group; isopropyl group, isobutyl group, sec-butyl group, tert-butyl group, isopentyl group, neopentyl group, tert-pentyl group, isohexyl group, or other branched alkyl group; cyclopropyl group, cyclobutyl group, cyclopentyl group, cyclohexyl group, or other cycloalkyl group; etc. may be mentioned.

As the $C_2$ to $C_{30}$ alkenyl group, vinyl group, allyl group, 1-propenyl group, isopropenyl group, 1-butenyl group, 2-butenyl group, 3-butenyl group, 1-methyl-1-propenyl group, 1-methyl-2-propenyl group, 2-methyl-1-propenyl group, 2-methyl-2-propenyl group, 1-pentenyl group, 2-pentenyl group, 3-pentenyl group, 4-pentenyl group, 1-methyl-1-butenyl group, 2-methyl-2-butenyl group, 3-methyl-2-butenyl group, 1,2-dimethyl-1-propenyl group, 1-decenyl group, 2-decenyl group, 8-decenyl group, 1-dodecenyl group, 2-dodecenyl group, 10-dodecenyl group, etc. may be mentioned.

As the $C_2$ to $C_{30}$ alkynyl group, an ethynyl group, 1-propynyl group, 2-propynyl group, 1-butynyl group, 2-butynyl group, 3-butynyl group, 1-methyl-1-propynyl group, 1-methyl-2-propynyl group, 2-methyl-1-propynyl group, 2-methyl-2-propynyl group, 1-pentynyl group, 2-pentynyl group, 3-pentynyl group, 4-pentynyl group, 1-methyl-1-butynyl group, 2-methyl-2-butynyl group, 3-methyl-2-butynyl group, 1,2-dimethyl-1-propynyl group, 1-decynyl group, 2-decynyl group, 8-decynyl group, 1-dodecynyl group, 2-dodecynyl group, 10-dodecynyl group, etc. may be mentioned.

In one embodiment of the present invention, from the viewpoint of being able to make the action and effect of one embodiment of the present invention (in particular, raising the exposure sensitivity) more remarkable, $R^1$, $R^2$, and $R^3$ are preferably $C_6$ to $C_{30}$ aryl groups, particularly preferably phenyl groups.

Further, in the above general formula (1), "a" is an integer of 1 to 5, preferably 2 to 4, more preferably 2 or 3, furthermore preferably 3. If "a" is in this range, the exposure sensitivity and low corrosiveness to metal can be improved with a good balance.

In the radiation-sensitive resin composition of one embodiment of the present invention, the content of the sulfonium salt-based photoacid generator (B) is preferably 1 to 15 parts by weight with respect to 100 parts by weight of the alicyclic olefin polymer (A), more preferably 1.5 to 10 parts by weight, furthermore preferably 2 to 7 parts by weight, most preferably 3 to 6 parts by weight. By making the content of the sulfonium salt-based photoacid generator (B) this range, the resin film obtained using the radiation-sensitive resin composition of one embodiment of the present invention can be made more excellent in exposure sensitivity, transparency after baking in an oxidizing atmosphere, and low corrosiveness to metal.

(Cross-Linking Agent (C))

The radiation-sensitive resin composition of one embodiment of the present invention contains a cross-linking agent (C) in addition to the above-mentioned alicyclic olefin polymer (A) and sulfonium salt-based photoacid generator (B). The cross-linking agent (C) used in one embodiment of the present invention is one which forms a cross-linked structure between cross-linking agent molecules due to heating or one which reacts with the alicyclic olefin polymer (A) to form a cross-linked structure between resin molecules, specifically, a compound which has two or more reactive groups may be mentioned. As such a reactive group, for example, an amino group, carboxy group, hydroxyl group, epoxy group, oxetanyl group, or isocyanate group may be mentioned. More preferably, it is an amino group, epoxy group, oxetanyl group, or isocyanate group. An epoxy group or oxetanyl group is more preferable, while an epoxy group is particularly preferable. That is, as the cross-linking agent (C), a compound which has two or more epoxy groups or a compound which has two or more oxetanyl groups is particularly preferable. In particular, a compound which has two or more epoxy groups is preferably used. Further, by jointly using, in addition to a compound which has two or more epoxy groups, a compound which has two or more oxetanyl groups, it is possible to raise the exposure sensitivity more, so these are preferably used together.

The molecular weight of the cross-linking agent (C) is not particularly limited, but is usually 100 to 100,000, preferably 100 to 50,000, more preferably 200 to 10,000. The cross-linking agent (C) can be respectively used alone or as two types or more combined. In particular, by using two types or more combined, the resin film which is obtained using the radiation-sensitive resin composition of one embodiment of the present invention can be made more excellent in exposure sensitivity of the film, shape retention after baking, and transparency.

As specific examples of the cross-linking agent (C), hexamethylenediamine and other aliphatic polyamines; 4,4'-diaminodiphenyl ether, diaminodiphenyl sulfone, and other aromatic polyamines; 2,6-bis(4'-azidebenzal)cyclohexanone, 4,4'-diazidediphenyl sulfone, and other azides; nylon, polyhexamethylenediamine terephthalamide, polyhexamethyleneisophthalamide, and other polyamides; N,N,N',N',N",N"-(hexaalkoxyalkyl) melamine, and other melamines which may have a methylol group, imino group, etc. (product name "Cymel 303, Cymel 325, Cymel 370, Cymel 232, Cymel 235, Cymel 272, Cymel 212, Mycoat 506" (above, made by Cytec Industries) and other Cymel series and Mycoat series products); N,N',N",N"'-(tetraalkoxyalkyl)glycoluril, and other glycolurils which may have a methylol group, imino group etc. (product name "Cymel 1170" (above, made by Cytec Industries) and other Cymel series products); ethylene glycol di(meth)acrylate and other acrylate compounds; hexamethylene diisocyanate-based polyisocyanate, isophorone diisocyanate-based polyisocyanate, tolylene diisocyanate-based polyisocyanate, hydrated diphenylmethane diisocyanate, and other isocyanate-based compounds; 1,4-di-(hydroxymethyl)cyclohexane, 1,4-di-(hydroxymethyl) norbornane; 3-ethyl-3 {[(3-ethyloxetan-3-yl) methoxy]methyl}oxetane, and other bisoxetanes (product name "OXT-121, OXT-221, RSOX, 4,4'-BPOX", above, made by Toagosei), trisoxetanes, novolac-type oxetanes (product name "PNOX-1009", made by Toagosei), calixarene-type oxetanes, cardo-type oxetanes, polyhydroxystyrene-type oxetanes, and other oxetane compounds; 1,3,4-trihydroxycyclohexane; bisphenol A-type epoxy resin, bisphenol F-type epoxy resin, phenol novolac-type epoxy resin, cresol novolac-type epoxy resin, polyphenol-type epoxy resin, cyclic aliphatic epoxy resin, aliphatic glycidyl ether, epoxy acrylate polymer, and other epoxy compounds; may be mentioned.

As specific examples of the epoxy compound, a trifunctional epoxy compound which has a dicyclopentadiene structure (product name "XD-1000", made by Nippon Kayaku), a 1,2-epoxy-4-(2-oxiranyl)cyclohexane adduct of 2,2- bis(hydroxymethyl) 1-butanol (pentadecafunctional alicyclic epoxy resin having a cyclohexane structure and end epoxy groups, product name "EHPE3150", made by Daicel Chemical Industry), epoxylated 3-cyclohexene-1,2-dicarboxylic acid bis(3-cyclohexenylmethyl)-modified ε-caprolactone (aliphatic cyclic trifunctional epoxy resin, product name "Epolide GT301", made by Daicel Chemical Industry), epoxylated butanetetracarboxylic acid tetrakis(3-cyclohexenylmethyl)-modified ε-caprolactone (aliphatic cyclic tetrafunctional epoxy resin, product name "Epolide GT401", made by Daicel Chemical Industry), 3,4-epoxy cyclohexenylmethyl-3',4'-epoxy cyclohexenecarboxylate (product name "Celloxide 2021" and "Celloxide 2021P", made by Daicel Chemical Industry), 1,2:8,9-diepoxylimonene (product name "Celloxide 3000", made by Daicel Chemical Industry), 2-(3,4-epoxy cyclohexyl)ethyltrimethoxysilane (product name "Z-6043", made by Toray-Dow Corning), and other epoxy compounds which have alicyclic structures; aromatic amine-type polyfunctional epoxy compound (product name "H-434", made by Tohto Chemical Industry), tris(2,3-epoxy propyl) isocyanurate (polyfunctional epoxy compound which has triazine structure, product name "TEPIC", made by Nissan Chemical Industries), cresol novolac-type polyfunctional epoxy compound (product name "EOCN-1020", made by Nippon Kayaku), phenol novolac-type polyfunctional epoxy compound (Epicoat 152, 154, made by Japan Epoxy Resin), polyfunctional epoxy compound having a naphthalene sturcture (product name EXA-4700, made by DIC), chain alkylpolyfunctional epoxy compound (product name "SR-TMP", made by Sakamoto Yakuhin Kogyo Co., Ltd.), polyfunctional epoxy polybutadiene (product name "Epolide PB3600", made by Daicel Chemical Industry), glycidyl polyether compound of glycerin (product name "SR-GIG", made by Sakamoto Yakuhin Kogyo Co., Ltd.), diglycerin polyglycidyl ether compound (product name "SR-DGE", made by Sakamoto Yakuhin Kogyo Co., Ltd.), polyglycerin polyglycidyl ether compound (product name "SR-4GL", made by Sakamoto Yakuhin Kogyo Co., Ltd.), glycidoxypropyltrimethylsilane (product name "Z-6040", made by Toray-Dow Corning), and other epoxy compounds which do not have alicyclic structures; may be mentioned.

In the radiation-sensitive resin composition of one embodiment of the present invention, the content of the cross-linking agent (C) is not particularly limited. This may be freely set considering the extent of heat resistance sought for the resin film which is obtained using the radiation-sensitive resin composition of one embodiment of the present invention, but is usually 5 to 150 parts by weight with respect to 100 parts by weight of the alicyclic olefin polymer (A), preferably 20 to 120 parts by weight, more preferably 30 to 100 parts by weight. Whether the cross-linking agent (C) is too great or too small, the heat resistance tends to fall. Note that, if using a plurality of types of compounds as the cross-linking agent (C), the content of the cross-linking agent (C) is the total of the contents of the cross-linking agents.

(Antioxidant (D))

Further, the radiation-sensitive resin composition of one embodiment of the present invention preferably further contains an antioxidant (D) in addition to the above-mentioned alicyclic olefin polymer (A), sulfonium salt-based photoacid generator (B), and cross-linking agent (C). The antioxidant (D) is not particularly limited, but a phenol-based antioxidant, phosphorus-based antioxidant, sulfur-based antioxidant, amine-based antioxidant, lactone-based antioxidant, etc. can be used. By including an antioxidant, the obtained resin film can be improved in light resistance and heat resistance.

As the phenol-based antioxidant, a conventionally known one can be used. For example, 2-t-butyl-6-(3-t-butyl-2-hydroxy-5-methylbenzyl)-4-methylphenylacrylate, 2,4-di-t-amyl-6-[1-(3,5-di-t-amyl-2-hydroxyphenyl)ethyl]phenylacrylate, or other acrylate-based compounds described in Japanese Patent Publication No. 63-179953A or Japanese Patent Publication No. 1-168643A; 2,6-di-t-butyl-4-methylphenol, 2,6-di-t-butyl-4-ethylphenol, octadecyl-3-(3,5-di-t-butyl-4-hydroxyphenyl)propionate, 2,2'-methylene-bis(4-methyl-6-t-butylphenol), 4,4'-butylidene-bis(6-t-butyl-m-cresol), 4,4'-thiobis(3-methyl-6-t-butylphenol), bis(3-cyclohexyl-2-hydroxy-5-methylphenyl)methane, 3,9-bis[2-[3-(3-t-butyl-4-hydroxy-5-methylphenyl)propionyloxy]-1, 1-dimethylethyl]-2,4, 8, 10-tetraoxaspiro[5, 5]undecane, 1,1,3-tris(2-methyl-4-hydroxy-5-t-butylphenyl) butane, pentaerythritol-tetrakis[3-(3,5-di-tert-butyl-4-hydroxyphenyl)propionate], triethylene glycol bis[3-(3-t-butyl-4-hydroxy-5-methylphenyl)propionate], tocopherol, or other alkyl-substituted phenol-based compounds; 6-(4-hydroxy-3, 5-di-t-butylanilino)-2,4-bis-octylthio-1,3,5-triazine, 6-(4-hydroxy-3,5-dimethylanilino)-2,4-bis-octylthio-1,3,5-triazine, 6-(4-hydroxy-3-methyl-5-t-butylanilino)-2,4-bis-octylthio-1,3,5-triazine, 2-octylthio-4,6-bis-(3,5-di-t-butyl-4-oxyanilino)-1,3,5-triazine, or other triazine group-containing phenol-based compounds; etc. may be used.

The phosphorus-based antioxidant is not particularly limited so long as one normally used in the general resin industry. For example, triphenyl phosphite, diphenylisodecyl phosphite, phenyldiisodecyl phosphite, tris(nonylphenyl)phosphite, tris(dinonylphenyl)phosphite, tris(2,4-di-t-butylphenyl)phosphite, tris(2-t-butyl-4-methylphenyl) phosphite, tris(cyclohexylphenyl)phosphite, 2,2'-methylenebis(4,6-di-t-butylphenyl) octylphosphite, 9, 10-dihydro-9-oxa-10-phosphaphenanthrene-10-oxide, 10-(3,5-di-t-butyl-4-hydroxybenzyl)-9,10-dihydro-9-oxa-10-phosphaphenanthrene-10-oxide, 10-desiloxy-9,10-dihydro-9-oxa-10-phosphaphenanthrene, or other monophosphite-based compounds; 4,4'-butylidene-bis(3-methyl-6-t-butylphenyl-di-tridecylphosphite), 4,4'-isopropylidene-bis[phenyl-di-alkyl ($C_{12}$ to $C_{15}$)phosphite], 4,4'-isopropylidene-bis[diphenylmonoalkyl ($C_{12}$ to $C_{15}$) phosphite], 1,1,3-tris(2-methyl-4-di-tridecylphosphite-5-t-butylphenyl) butane, tetrakis(2,4-di-t-butylphenyl)-4,4'-biphenylenediphosphite, cyclic neopentanetetrayl bis (octadecylphosphite), cyclic neopentanetetrayl bis (isodecylphosphite), cyclic neopentanetetrayl bis (nonylphenylphosphite), cyclic neopentanetetrayl bis(2,4-di-t-butylphenylphosphite), cyclic neopentanetetrayl bis(2, 4-dimethylphenylphosphite), cyclic neopentanetetrayl bis(2, 6-di-t-butylphenylphosphite), or other diphosphite-based compounds etc. may be used. Among these as well, a monophosphite-based compound is preferable, while tris (nonylphenyl)phosphite, tris(dinonylphenyl)phosphite, tris (2,4-di-t-butylphenyl)phosphate, etc. are particularly preferable.

As the sulfur-based antioxidant, for example, dilauryl 3,3'-thiodipropionate, dimyristyl 3,3'-thiodipropionate, distearyl 3,3'-thiodipropionate, laurylstearyl 3,3'-thiodipropionate, pentaerythritoltetrakis-(β-laurylthiopropionate), 3,9-bis(2-dodecylthioethyl)-2,4, 8, 10-tetraoxaspiro[5, 5]undecane, etc. may be used.

Among these as well, a phenol-based antioxidant is preferable, pentaerythritol tetrakis[3-(3,5-di-tert-butyl-4-hydroxyphenyl)propionate] is more preferable.

These antioxidants may be used respectively alone or as two types or more combined.

In the radiation-sensitive resin composition of one embodiment of the present invention, the content of the antioxidant (D) is preferably 0.1 to 15 parts by weight with respect to 100 parts by weight of the alicyclic olefin polymer (A), more preferably 1 to 8 parts by weight. If the content of the antioxidant is in the above range, the obtained resin film can be made more excellent in light resistance and heat resistance.

(Other Compounding Agents)

The radiation-sensitive resin composition of one embodiment of the present invention may further contain a solvent. The solvent is not particularly limited, but one known as a solvent of a resin composition, for example, acetone, methylethylketone, cyclopentanone, 2-hexanone, 3-hexanone, 2-heptanone, 3-heptanone, 4-heptanone, 2-octanone, 3-octanone, 4-octanone, or other straight chain ketones; n-propyl alcohol, isopropyl alcohol, n-butyl alcohol, cyclohexanol, or other alcohols; ethyleneglycol dimethyl ether, ethyleneglycol diethyl ether, dioxane, or other ethers; ethyleneglycol monomethyl ether, ethyleneglycol monoethyl ether, or other alcohol ethers; propyl formate, butyl formate, propyl acetate, butyl acetate, methyl propionate, ethyl propionate, methyl butyrate, ethyl butyrate, methyl lactate, ethyl lactate, or other esters; cellosolve acetate, methylcellosolve acetate, ethylcellosolve acetate, propylcellosolve acetate, butylcellosolve acetate, or other cellosolve esters; propyleneglycol, propyleneglycol monomethyl ether, propylene glycol monomethyl ether acetate, propylene glycol monoethyl ether acetate, propylene glycol monobutyl ether, or other propylene glycols; diethylene glycol monomethyl ether, diethylene glycol monoethyl ether, diethylene glycol dimethyl ether, diethylene glycol diethyl ether, diethylene glycol methylethyl ether, or other diethylene glycols; γ-butyrolactone, γ-valerolactone, γ-caprolactone, γ-caprylolactone, or other saturated γ-lactones; trichloroethylene or other halogenated hydrocarbons; toluene, xylene, or other aromatic hydrocarbons; dimethylacetoamide, dimethylformamide, N-methylacetoamide, or other polar solvents; etc. may be mentioned. These solvents may be used alone or as two types or more combined. The content of the solvent is preferably 10 to 10000 parts by weight with respect to 100 parts by weight of the alicyclic olefin polymer (A), more preferably 50 to 5000 parts by weight, furthermore preferably 100 to 1000 parts by weight in range. Note that, when the resin composition is made to include a solvent, the solvent is normally removed after forming the resin film.

Further, the radiation-sensitive resin composition of one embodiment of the present invention may also contain, as desired to an extent where the effect of one embodiment of the present invention is not inhibited, a surfactant, a compound having an acidic group or thermolatent acidic group, a coupling agent or its derivatives, a sensitizer, basic compound, photostabilizer, defoaming agent, pigment, dye, filler, and other compounding agents; etc. Among these, for example, the coupling agent or its derivative, sensitizer, or photostabilizer used may be one described in Japanese Patent Publication No. 2011-75609A.

The surfactant is used to prevent striation, improve the development property, and for other purposes. As the surfactant, for example, a silicone-based surfactant, fluorine-based surfactant, polyoxyalkylene-based surfactant, methacrylic acid copolymer-based surfactant, acrylic acid copolymer-based surfactant, etc. may be mentioned.

As the silicone-based surfactant, for example, "SH28PA", "SH29PA", "SH30PA", "ST80PA", "ST83PA", "ST86PA", "SF8416", "SH203", "SH230", "SF8419", "SF8422", "FS1265", "SH510", "SH550", "SH710", "SH8400", "SF8410", "SH8700", "SF8427" (above, made by Toray-Dow Corning), product name "KP-321", "KP-323", "KP-324", "KP-340", "KP-341" (above, made by Shin-Etsu Chemical), product name "TSF400", "TSF401", "TSF410", "TSF4440", "TSF4445", "TSF4450", "TSF4446", "TSF4452", "TSF4460" (above, made by Momentive Performance Materials Japan), product name "BYK300", "BYK301", "BYK302", "BYK306", "BYK307", "BYK310", "BYK315", "BYK320", "BYK322", "BYK323", "BYK331", "BYK333", "BYK370", "BYK375", "BYK377", "BYK378" (above, made by BYK Chemie Japan), etc. may be mentioned.

As the fluorine-based surfactant, for example, Fluorinert "FC-430", "FC-431" (above, made by Sumitamo 3M), Surflon "S-141", "S-145", "S-381", "S-393" (above, made by Asahi Glass), EFTOP (Registered Trademark) "EF301", "EF303", "EF351", and "EF352" (above, made by JEMCO)), Megafac (Registered Trademark) "F171", "F172", "F173", "R-30" (above, made by DIC) etc. may be mentioned.

As the polyoxyalkylene-based surfactant, for example, polyoxyethylenelauryl ether, polyoxyethylenestearyl ether, polyoxyethyleneoleyl ether, polyoxyethyleneoctylphenyl ether, polyoxyethylenenonylphenyl ether, and other polyoxyethylenealkyl ethers, polyethyleneglycol dilaurate, polyethyleneglycol distearate, and other polyoxyethylene dialkyl esters, etc. may be mentioned.

These surfactants may be respectively used alone or as two or more types combined.

In the radiation-sensitive resin composition of one embodiment of the present invention, the content of the surfactant is preferably 0.01 to 0.5 part by weight with respect to 100 parts by weight of the alicyclic olefin polymer (A), more preferably 0.02 to 0.2 part by weight. If the content of the surfactant is in the above range, the effect of prevention of striation can be raised more.

The compound having an acidic group or thermolatent acidic group is not particularly limited so long as one having an acidic group or thermolatent acidic group which gives an acidic group by heating, but is preferably an aliphatic compound, aromatic compound, or heterocyclic compound, furthermore preferably an aromatic compound and heterocyclic compound.

These compounds having acidic groups or thermolatent acidic groups can be used respectively independently or as two types or more combined. By mixing compounds having acidic groups or thermolatent acidic groups, the resin film obtained using the radiation-sensitive resin composition of one embodiment of the present invention can be raised more in shape retention after baking.

The number of acidic groups of the compound which has an acidic group is not particularly limited, but a compound which has two or more acidic groups is preferable. The acidic groups may be the same as or different from each other.

The acidic group may be an acidic functional group. As specific examples, a sulfonic acid group, phosphoric acid group, and other strong acidic groups; a carboxyl group, thiol group, carboxymethylenethio groups, and other weak acidic groups; may be mentioned. Among these as well, a carboxyl group, thiol group, or carboxymethylenethio group is preferable, while a carboxyl group is particularly preferable. Further, among these acidic groups as well, one in which the acid dissociation constant pKa is 3.5 to 5.0 in range is preferable. Note that, when there are two or more acidic groups, the first dissociation constant pKa1 is made the acid dissociation constant and one in which the first dissociation constant pKa1 is in the above range is preferable. Further, pKa is found in accordance with pKa=−log Ka by measurement of the acid dissociation constant Ka= $[H_3O^+][B^-]/[BH]$ under a dilute aqueous solution conditions. Here, BH indicates an organic acid, while $B^-$ indicates a conjugate base of an organic acid. Note that, the method of measurement of pKa can, for example, be use of a pH meter for measurement of the concentration of hydrogen ions and calculation from the concentration of the substance and the concentration of the hydrogen ions.

Further, the compound having an acidic group may also have a substituent other than an acidic group.

As such a substituent, an alkyl group, aryl group, and other hydrocarbon groups and in addition a halogen atom; alkoxy group, aryloxy group, acyloxy group, heterocyclic oxy group; amino group, acylamino group, ureido group, sulfamoylamino group, alkoxycarbonylamino group, or aryloxycarbonylamino group substituted by an alkyl group, aryl group or heterocyclic group; alkylthio group, arylthio group, heterocyclic thio group; and other polar groups not having a proton, hydrocarbon groups which are substituted by these polar groups not having a proton, etc. may be mentioned.

As specific examples of such a compound having an acidic group, methanoic acid, ethanoic acid, propanoic acid, butanoic acid, pentanoic acid, hexanoic acid, heptanoic acid, octanoic acid, nonanoic acid, decanoic acid, glycolic acid, glyceric acid, ethanoic diacid (also called "oxalic acid"), propanoic diacid (also called "malonic acid"), butanoic diacid (also called "succinic acid"), pentanoic diacid, hexanoic diacid (also called "adipic acid"), 1,2-cyclohexanedicarboxylic acid, 2-oxopropanoic acid, 2-hydroxybutanoic diacid, 2-hydroxypropane tricarboxylic acid, mercaptosucinnic acid, dimercaptosucinnic acid, 2,3-dimercapto-1-propanol, 1,2,3-trimercaptopropane, 2,3,4-trimercapto-1-butanol, 2,4-dimercapto-1,3-butanediol, 1,3,4-trimercapto-2-butanol, 3,4-dimercapto-1,2-butanediol, 1,5-dimercapto-3-thiapentane, and other aliphatic compounds;

benzoic acid, p-hydroxybenzenecarboxylic acid, o-hydroxybenzenecarboxylic acid, 2-naphthalenecarboxylic acid, methylbenzoic acid, dimethylbenzoic acid, trimethylbenzoic acid, 3-phenylpropane acid, dihydroxybenzoic acid, dimethoxybenzoic acid, benzene-1,2-dicarboxylic acid (also referred to as "phthalic acid"), benzene-1,3-dicarboxylic acid (also referred to as "isophthalic acid"), benzene-1,4-dicarboxylic acid (also referred to as "terephthalic acid"), benzene-1,2,3-tricarboxylic acid, benzene-1,2,4-tricarboxylic acid, benzene-1,3,5-tricarboxylic acid, benzenehexacarboxylic acid, biphenyl-2,2'-dicarboxylic acid, 2-(carboxymethyl)benzoic acid, 3-(carboxymethyl)benzoic acid, 4-(carboxymethyl)benzoic acid, 2-(carboxycarbonyl)benzoic acid, 3-(carboxycarbonyl)benzoic acid, 4-(carboxycarbonyl)benzoic acid, 2-mercaptobenzoic acid, 4-mercaptobenzoic acid, diphenol acid, 2-mercapto-6-naphthalenecarboxylic acid, 2-mercapto-7-naphthalenecarboxylic acid, 1,2-dimercaptobenzene, 1,3-dimercaptobenzene, 1,4-dimercaptobenzene, 1,4-naphthalenedithiol, 1,5-naphthalenedithiol, 2,6-naphthalenedithiol, 2,7-naphthalenedithiol, 1,2,3-trimercaptobenzene, 1,2,4-trimercaptobenzene, 1,3,5-trimercaptobenzene, 1,2,3-tris(mercaptomethyl)benzene, 1,2,4-tris(mercaptomethyl)benzene, 1,3,5-tris(mercaptomethyl)benzene, 1,2,3-tris(mercaptoethyl)benzene, 1,2,4-tris(mercaptoethyl)benzene, 1,3,5-tris(mercaptoethyl)benzene, and other aromatic compound;

nicotinic acid, isonicotinic acid, 2-furoic acid, pyrrole-2,3-dicarboxylic acid, pyrrole-2,4-dicarboxylic acid, pyrrole-2,5-dicarboxylic acid, pyrrole-3,4-dicarboxylic acid, imidazole-2,4-dicarboxylic acid, imidazole-2,5-dicarboxylic acid, imidazole-4,5-dicarboxylic acid, pyrazole-3,4-dicarboxylic acid, pyrazole-3,5-dicarboxylic acid, or other five-member heterocyclic compound which contains nitrogen atoms; thiophen-2,3-dicarboxylic acid, thiophen-2,4-dicarboxylic acid, thiophen-2,5-dicarboxylic acid, thiophen-3,4-dicarboxylic acid, thiazole-2,4-dicarboxylic acid, thiazole-2,5-dicarboxylic acid, thiazole-4,5-dicarboxylic acid, isothiazole-3,4-dicarboxylic acid, isothiazole-3,5-dicarboxylic acid, 1,2,4-thiadiazole-2,5-dicarboxylic acid, 1,3,4-thiadiazole-2,5-dicarboxylic acid, 3-amino-5-mercapto-1,2,4-thiadiazole, 2-amino-5-mercapto-1,3,4-thiadiazole, 3,5-dimercapto-1,2,4-thiadiazole, 2,5-dimercapto-1,3,4-thiadiazole, 3-(5-mercapto-1,2,4-thiadiazol-3-ylsulfanyl) succinic acid, 2-(5-mercapto-1,3,4-thiadiazol-2-ylsulfanyl) succinic acid, (5-mercapto-1,2,4-thiadiazol-3-ylthio) acetic acid, (5-mercapto-1,3,4-thiadiazol-2-ylthio) acetic acid, 3-(5-mercapto-1,2,4-thiadiazol-3-ylthio)propionic acid, 2-(5-mercapto-1,3,4-thiadiazol-2-ylthio)propionic acid, 3-(5-mercapto-1,2,4-thiadiazol-3-ylthio) succinic acid, 2-(5-mercapto-1,3,4-thiadiazol-2-ylthio) succinic acid, 4-(3-mercapto-1,2,4-thiadiazol-5-yl)thiobutanesulfonic acid, 4-(2-mercapto-1,3,4-thiadiazol-5-yl)thiobutanesulfonic acid, and other five-member heterocyclic compounds which include nitrogen atoms and sulfur atoms;

pyridine-2,3-dicarboxylic acid, pyridine-2,4-dicarboxylic acid, pyridine-2,5-dicarboxylic acid, pyridine-2,6-dicarboxylic acid, pyridine-3,4-dicarboxylic acid, pyridine-3,5-dicarboxylic acid, pyridazine-3,4-dicarboxylic acid, pyridazine-3,5-dicarboxylic acid, pyridazine-3,6-dicarboxylic acid, pyridazine-4,5-dicarboxylic acid, pyrimidine-2,4-dicarboxylic acid, pyrimidine-2,5-dicarboxylic acid, pyrimidine-4,5-dicarboxylic acid, pyrimidine-4,6-dicarboxylic acid, pyradine-2,3-dicarboxylic acid, pyradine-2,5-dicarboxylic acid, pyridine-2,6-dicarboxylic acid, triazine-2,4-dicarboxylic acid, 2-diethylamino-4,6-dimercapto-s-triazine, 2-dipropylamino-4,6-dimercapto-s-triazine, 2-dibutylamino-4,6-dimercapto-s-triazine, 2-anilino-4,6-dimercapto-s-triazine, 2,4,6-trimercapto-s-triazine, and other six-member heterocyclic compounds which include nitrogen atoms may be mentioned.

Among these as well, from the viewpoint of being able to improve more the adhesion of the obtained cured film, the number of acidic groups is preferably two or more.

The compound having a thermolatent acidic group may be any group which gives an acidic group by heating. As specific examples of the acidic group, a sulfonium salt group, benzothiazolium salt group, ammonium salt group, phosphonium salt group, block carboxylic acid group, etc. may be mentioned. Among these as well, a sulfonium salt group is preferable, for example, a phosphorus hexafluoride-based or antimony hexafluoride-based sulfonium salt group may be used. As such a sulfonium salt group, for example, the San-aid SI series (100L, 110L, 150, and 180L, made by Sanshin Chemical Industry) etc. may be used.

In the radiation-sensitive resin composition of one embodiment of the present invention, the content of the compound having an acidic group or thermolatent acidic group is preferably 0.1 to 50 parts by weight with respect to 100 parts by weight of the alicyclic olefin polymer (A), more preferably 1 to 45 parts by weight, furthermore preferably 2 to 40 parts by weight, particularly preferably 3 to 30 parts by weight in range. By making the amount of use of the compound having an acidic group or thermolatent acidic group the above range, it is possible to more suitably raise the shape retention of the obtained resin film after baking.

The basic compound can be freely selected for use from among ones able to be used in chemically amplified resists. For example, an aliphatic amine, aromatic amine, heterocyclic type amine, quaternary ammonium hydroxide, etc. may be mentioned.

As the aliphatic amine, for example, trimethylamine, diethylamine, triethylamine, di-n-propylamine, tri-n-propylamine, di-n-pentylamine, tri-n-pentylamine, diethanolamine, triethanolamine, dicyclohexylamine, dicyclohexylmethylamine, etc. may be mentioned.

As the aromatic amine, for example, aniline, benzylamine, N,N-dimethylaniline, diphenylamine, etc. may be mentioned.

As the heterocyclic type amine, for example, pyridine, 2-methylpyridine, 4-methylpyridine, 2-ethylpyridine, 4-ethylpyridine, 2-phenylpyridine, 4-phenylpyridine, N-methyl-4-phenylpyridine, 4-dimethylaminopyridine, imidazole, benzimidazole, 4-methylimidazole, 2-phenylbenzimidazole, 2,4,5-triphenylimidazole, nicotine, nicotinic acid, nicotinic acid amide, quinoline, 8-oxyquinoline, pyradine, pyrazole, pyridazine, purine, pyrrolidine, piperidine, piperadine, morpholine, 4-methylmorpholine, 1,5-diazabicyclo[4.3.0]-5-nonene, 1,8-diazabicyclo[5.3.0]-7-undecene, etc. may be mentioned.

As the quaternary ammonium hydroxide, for example, tetramethylammonium hydroxide, tetraethylammonium hydroxide, tetra-n-butylammonium hydroxide, tetra-n-hexylammonium hydroxide, etc. may be mentioned.

These basic compounds may be used respectively alone or as two types or more combined.

In the radiation-sensitive resin composition of one embodiment of the present invention, the content of the basic compound is preferably 0.001 to 1 part by weight with respect to 100 parts by weight of the alicyclic olefin polymer (A), more preferably 0.003 to 0.3 part by weight. If the content of the basic compound is in the above range, the radiation-sensitive resin composition can be further raised in storage stability.

The method of preparation of the radiation-sensitive resin composition of one embodiment of the present invention is not particularly limited, but the ingredients forming the radiation-sensitive resin composition may be mixed by a known method.

The method of mixing is not particularly limited, but it is preferable to dissolve or disperse the components which form the radiation-sensitive resin composition in solvents and mix the solutions or dispersions. Due to this, the radiation-sensitive resin composition is obtained in the form of a solution or dispersion.

The method of dissolving or dispersing the components which form the radiation-sensitive resin composition in solvents may be an ordinary method. Specifically, this may be performed by stirring using a stirring bar and magnetic stirrer, high speed homogenizer, disperser, planetary stirrer, twin-screw stirrer, ball mill, triple roll, etc. Further, the ingredients may also be dissolved or dispersed in a solvent, then for example filtered using a filter with a pore size of 0.5 µm or so etc.

(Electronic Device)

Next, the electronic device of one embodiment of the present invention will be explained. The electronic device of one embodiment of the present invention has a resin film comprised of the above-mentioned radiation-sensitive resin composition of one embodiment of the present invention.

As the electronic device of one embodiment of the present invention, for example, one comprised of a substrate on which various devices are mounted, various devices which are formed by MEMS technology, etc. may be mentioned. Specifically, an active matrix substrate, organic EL device substrate, integrated circuit device substrate, solid state imaging device substrate, LED (light emitting diode) device, MEMS mirror device, etc. may be mentioned, but from the viewpoint of the particularly remarkable effect of improvement of characteristics due to formation of a resin film comprised of the above-mentioned radiation-sensitive resin composition of one embodiment of the present invention, a device with a surface on which metal interconnect patterns are formed is preferable. Specifically, the resin film comprised of the radiation-sensitive resin composition of one embodiment of the present invention may be suitably used for applications of interlayer insulating films for LED (light emitting diode) devices, applications of protective films for MEMS mirror devices, applications of insulating films for touch sensors, applications of protective films for chip size packages, applications of insulating films for reinterconnect layers of multilayer printed circuit boards, applications for MEMS structures may be mentioned, so the film is suitably used as such electronic devices.

In the electronic device of one embodiment of the present invention, the method of forming the resin film comprised of the radiation-sensitive resin composition of one embodiment of the present invention is not particularly limited, but for example the coating method, film lamination method, or other method can be used.

The coating method is, for example, the method of coating a radiation-sensitive resin composition, then drying by heating to remove the solvent. As the method of coating the radiation-sensitive resin composition, for example, the spray method, spin coat method, roll coat method, die coat method, doctor blade method, spin coat method, bar coat method, screen print method, and other various methods can be employed. The heating and drying conditions differ according to the type and ratio of the ingredients, but are usually 30 to 150° C., preferably 60 to 120° C. usually for 0.5 to 90 minutes, preferably 1 to 60 minutes, more preferably 1 to 30 minutes.

The film lamination method is a method comprising coating a radiation-sensitive resin composition on a resin film, metal film or other substrate for forming B-stage film, then heating and drying it to remove the solvent to obtain the B-stage film, then laminating this B-stage film. The heating and drying conditions may be suitably selected in accordance with the types and ratios of content of the ingredients, but the heating temperature is usually 30 to 150° C. and the heating time is usually 0.5 to 90 minutes. The film lamination may be performed by using a press laminator, press, vacuum laminator, vacuum press, roll laminator, and other press bonding machines.

The thickness of the resin film is not particularly limited, but may be suitably set in accordance with the application, but is preferably 0.1 to 100 µm, more preferably 0.5 to 50 µm, furthermore preferably 0.5 to 30 µm.

Next, the resin film which is formed in this way is patterned by a predetermined pattern. As the method of patterning a resin film, for example, the method of using the radiation-sensitive resin composition of one embodiment of the present invention to form a resin film before patterning, irradiating active radiation at the resin film before patterning to form latent patterns, then bringing the resin film which has the latent patterns into contact with the developing solution to bring out the patterns etc. may be mentioned.

The active radiation is not particularly limited so long as able to activate the sulfonium salt-based photoacid generator (B) contained in the radiation-sensitive resin composition and change the alkali solubility of the radiation-sensitive resin composition containing the sulfonium salt-based photoacid generator (B). Specifically, ultraviolet light, g-rays or i-rays and other single wavelength ultraviolet light, KrF excimer laser light, ArF excimer laser light, and other light beams; electron beams and other particle beams; etc. may be used. As the method of selectively radiating active radiation in a pattern manner to form latent patterns, an ordinary method may be used. For example, the method of using a reduced projection exposure apparatus etc. to irradiate ultraviolet light, g-rays, i-rays, KrF excimer laser light, ArF excimer laser light, and other light beams through a desired mask pattern or the method of using an electron beam or other particle beam for lithography etc. may be used. When using light beams as active radiation, single wavelength light or mixed wavelength light may be used. The irradiation conditions may be suitably selected in accordance with the active radiation used, but, for example, when using wavelength 200 to 450 nm light beams, the amount of irradiation is normally 10 to 1,000 $mJ/cm^2$, preferably 50 to 500 $mJ/cm^2$ in range and is determined in accordance with the irradiation time and illuminance. After irradiating the active radiation in this way, in accordance with need, the resin film is heat treated at 60 to 130° C. or so in temperature for 1 to 2 minutes or so.

Next, the latent patterns which are formed in the resin film before patterning are developed to bring them out. As the developing solution, normally aqueous solutions of alkali compounds may be used. As alkali compounds, for example, alkali metal salts, amines, and ammonium salts may be used. The alkaline compounds may be inorganic compounds or organic compounds. As specific examples of these compounds, sodium hydroxide, potassium hydroxide, sodium carbonate, sodium silicate, metasodium silicate, and other alkali metal salts; ammonia water; ethylamine, n-propylamine, and other primary amines; diethylamine, di-n-propylamine, and other secondary amines; triethylamine, methyldiethylamine, and other tertiary amines; tetramethylammonium hydroxide, tetraethylammonium hydroxide, tetrabutylammonium hydroxide, choline, and other quaternary ammonium salts; dimethylethanolamine, triethanolamine, and other alcohol amines; pyrrol, piperidine, 1,8-diazabicyclo[5.4.0]undec-7-ene, 1,5-diazabicyclo[4.3.0]non-5-ene, N-methylpyrrolidone, and other cyclic amines; etc. may be mentioned. These alkali compounds may be respectively used alone or as two types or more combined.

As the aqueous medium which is used as the aqueous solution of an alkali compound, water; methanol, ethanol, and other water soluble organic solvents may be used. The alkali aqueous solution may have a surfactant etc. added in a suitable amount.

As the method for bringing the developing solution in contact with the resin film which has the latent patterns, for example, the puddle method, spray method, dipping method, and other methods may be used. The development conditions are suitably selected as normally 0 to 100° C., preferably 5 to 55° C., more preferably 10 to 30° C. and normally 30 to 180 seconds.

The resin film which is formed with the targeted patterns in this way may be rinsed by a rinse solution in accordance with need so as to remove development residue. After the rinse treatment, the remaining rinse solution is removed by compressed air or compressed nitrogen.

Further, in accordance with need, after development, the resin film may be heated. As the heating method, for example, the method of heating the electronic device by a hot plate or inside an oven may be mentioned. The temperature is usually 100 to 300° C., preferably 120 to 200° C. in range.

The thus formed resin film can be subjected to a cross-linking reaction after patterning. This cross-linking may be performed by selecting a suitable method in accordance with the type of the cross-linking agent (C) which is included in the radiation-sensitive resin composition, but usually is performed by heating. The heating method, for example, may be one using a hot plate, oven, etc. The heating temperature is usually 180 to 250° C. The heating time is suitably selected in accordance with the area or thickness of the resin film, the equipment used, etc. For example, when using a hot plate, it is normally 5 to 60 minutes, while when using an oven, it is normally 30 to 90 minutes in range. The heating may be performed in accordance with need in an inert gas atmosphere. The inert gas may be one which does not contain oxygen and which does not oxidize a resin film. For example, nitrogen, argon, helium, neon, xenon, krypton, etc. may be mentioned. Among these as well, nitrogen and argon are preferable. In particular, nitrogen is preferable. In particular, inert gas with an oxygen content of 0.1 vol % or less, preferably 0.01 vol % or less, in particular nitrogen, is suitable. These inert gases may be respectively used alone or as two types or more combined.

In this way, an electronic device provided with a patterned resin film can be produced.

Note that, in the electronic device of one embodiment of the present invention, depending on the type of the electronic device, after forming the thus patterned resin film, still other component elements (for example, metal interconnect patterns, ITO electrodes, oriented film, etc.) are baked in the atmosphere or other oxidizing atmosphere. The baking temperature at this time is usually 150 to 350° C., preferably 180 to 300° C., more preferably 200 to 250° C. Note that, at this time, the patterned resin film obtained using the radiation-sensitive resin composition of one embodiment of the present invention also is similarly baked in an oxidizing atmosphere. However, on the other hand, the thus formed resin film is obtained using the above-mentioned radiation-sensitive resin composition of one embodiment of the present invention, so even after baking in an oxidizing atmosphere in this way, a high transparency can be realized. For this reason, this is suitable for applications of electronic devices where, after that, formation of other component elements (for example, metal interconnect patterns, ITO electrodes, oriented films, etc.) becomes necessary, specifically applications of LED (light emitting diode) devices, MEMS mirror devices, active matrix substrates, organic EL device substrates, or other various electronic device applications. Further, in addition to this, the resin film obtained using the radiation-sensitive resin composition of one embodiment of the present invention is high in exposure sensitivity, so it is possible to reduce the amount of irradiation at the time of manufacture and due to this the productivity can be improved. Furthermore, the resin film obtained using the radiation-sensitive resin composition of one embodiment of the present invention is excellent in low corrosiveness to metal, so fine metal interconnect patterns can be formed with a high precision and high reliability. Due to this, it is possible to contribute to smaller sizes and higher performances of electronic devices.

EXAMPLES

Below, examples and comparative examples will be given to more specifically explain one embodiment of the present invention. In the examples, "parts" are based on weight unless otherwise indicated.

Note that, the definitions and methods of evaluation of the properties were as follows.

<Exposure Sensitivity>

A silicon wafer substrate was coated with a radiation-sensitive resin composition by the spin coat method, then a hot plate was used to heat this to dry at 90° C. for 2 minutes (prebaking) to form a thickness 2 μm resin film. Next, in order to pattern the resin film, the resin film was exposed where a step tablet mask and PLA501F (made by Canon) were used to change the amount of exposure by 10 mJ/cm$^2$ intervals from 0 mJ/cm$^2$ to 500 mJ/cm$^2$ to thereby perform an exposure process. Next, a hot plate was used to heat this at 130° C. for 1 minute, a 0.4 wt % tetramethylammonium hydroxide aqueous solution was used for development at 25° C. for 100 seconds, then ultrapure water was used for rinsing for 30 seconds to thereby obtain a laminate comprised of a resin film having an exposure pattern different in exposure amounts and a silicon wafer substrate.

Further, the amount of exposure by which the thickness after development becomes 95% or more with respect to the thickness after coating was calculated and found as the exposure sensitivity. The lower the amount of exposure, the more possible it is to form the patterns by a low energy or short time period, so this is preferable.

<Heat Resistant Transparency>

A glass substrate (product name Corning 1737, made by Corning) was coated with a radiation-sensitive resin composition by spin coat method, then a hot plate was used to heat this to dry at 90° C. for 2 minutes (prebaking) to form a thickness 2 μm resin film. Next, this resin film was exposed in air by the amount of exposure found by the above evaluation of exposure sensitivity. Next, a hot plate was used to heat this at 130° C. for 1 minute. This was dipped in a 0.4 wt % tetramethylammonium hydroxide aqueous solution at 25° C. for 100 seconds, then was washed by ultrapure water for 30 seconds. Next, an oven was used to post bake this in an oxidizing atmosphere of an air atmosphere at 230° C. for 30 minutes to obtain a test sample comprised of a glass substrate formed with a resin film. Further, the obtained test sample baked in the oxidizing atmosphere was measured using a spectrophotometer V-560 (made by JASCO) at a 400 nm to 700 nm wavelength. The results of measurement at a 400 nm wavelength were used to find the light transmittance of the resin film. Note that, the light transmittance of the resin film was calculated using a glass substrate not provided with a resin film as a blank and converting the value assuming a thickness of a resin film of 2 μm.

<Low Corrosiveness of Metal>

A glass substrate (product name Corning 1737, made by Corning) was formed with a thickness 100 nm aluminum thin film using a sputtering system. Next, a photoresist was used to pattern the aluminum thin film to prepare a comb-shaped electrode substrate with an Al interconnect width of 10 μm and interconnect pitch of 10 μm. The comb-shaped electrode substrate was coated with a radiation-sensitive resin composition by spin coat method, then a hot plate was used to heat and dry this at 90° C. for 2 minutes (prebaking) to form a thickness 2 μm resin film. Next, the amount of exposure found by the above evaluation of exposure sensitivity was used to perform the exposure process in the air. Next, a hot plate was used to heat this at 130° C. for 1 minute. Further, this resin film was dipped in a 0.4 wt % tetramethylammonium hydroxide aqueous solution at 25° C. for 100 seconds, then was washed by ultrapure water for 30 seconds. Next, an oven was used to post bake this in an air atmosphere at 230° C. for 30 minutes to obtain a sample for a test of low corrosiveness to metal formed with a resin film. Further, the obtained sample for a test of low corrosiveness to metal was placed in a temperature 60° C., humidity 90% constant climate chamber in a state with application of a 15V voltage. After 100 hours and after 200 hours, the sample was taken out and the sample was observed by an optical microscope to evaluate the low corrosiveness to metal by the following criteria.

A: No change in aluminum interconnects up to after 200 hours in constant climate chamber.

B: No change in aluminum interconnects up to after 100 hours in constant climate chamber, but corrosion recognized in aluminum interconnects after 200 hours.

C: Corrosion recognized in aluminum interconnects after 100 hours in constant climate chamber.

Synthesis Example 1

Preparation of Cyclic Olefin Polymer which has Acidic Group (A-1)

100 parts of monomer mixture comprised of 40 mol % of N-phenyl-bicyclo[2.2.1]hept-5-ene-2,3-dicarboxyimide (NBPI) and 60 mol % of 4-hydroxycarbonyltetracyclo[6.2.1.1$^{3,6}$.0$^{2,7}$]dodec-9-ene (TCDC), 2.8 parts of 1,5-hexadiene, 0.02 part of (1,3-dimesitylimidazolin-2-ylidene) (tricyclohexylphosphine)benzylidene ruthenium dichloride (synthesized by method described in Org. Lett., vol. 1, pp. 953, 1999), and 200 parts of diethyleneglycolethylmethyl ether were charged into a nitrogen-substituted glass pressure-resistant reactor and stirred while making them react at 80° C. for 4 hours to obtain a polymerization reaction solution.

Further, the obtained polymerization reaction solution was placed in an autoclave and stirred at 150° C. at a hydrogen pressure 4 MPa for 5 hours for a hydrogenation reaction to obtain a polymer solution which contains an alicyclic olefin polymer (A-1). The polymerization conversion rate of the obtained alicyclic olefin polymer (A-1) was 99.8%, the weight average molecular weight converted to polystyrene was 5,098, the number average molecular weight was 3,227, the molecular weight distribution was 1.58, and the hydrogenation rate was 99.9%. Further, the solid content concentration of the polymer solution of the obtained alicyclic olefin polymer (A-1) was 34.4 wt %.

Example 1

290.7 parts of the polymer solution of the alicyclic olefin polymer (A-1) obtained in Synthesis Example 1 (as alicyclic olefin polymer (A-1), 100 parts), 1 part of 4-(phenylthio)phenyldiphenylphosphonium tris(pentafluoroethyl)trifluorophosphate (product name "CPI-210S", made by San-Apro, compound shown by following formula (4)) as a sulfonium salt-based photoacid generator (B), 80 parts of 3,4-epoxy cyclohexenylmethyl-3',4'-epoxy cyclohexene carboxylate (product name "Celloxide 2021P", made by Daicel Chemical Industry) as a cross-linking agent (C), 6 parts of pentaerythritol-tetrakis[3-(3,5-di-tert-butyl-4-hydroxyphenyl)propionate](product name "Irganox 1010", made by BASF) as an antioxidant (D), and 200 parts of ethylene glycol dimethyl ether as a solvent were mixed and made to dissolve, then were filtered by a pore size 0.45 μm polytetrafluoroethylene filter to prepare a radiation-sensitive resin composition.

(4)

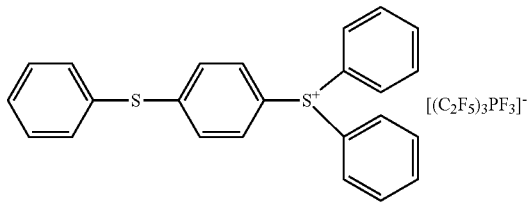

Further, using the above obtained radiation-sensitive resin composition, the exposure sensitivity, heat resistant transparency, and low corrosiveness to metal were evaluated. The results are shown in Table 1.

Example 2

Except for changing the amount of the sulfonium salt-based photoacid generator (B) constituted by 4-(phenylthio) phenyldiphenylphosphonium tris(pentafluoroethyl)trifluorophosphate from 1 part to 5 parts, the same procedure was followed as in Example 1 to obtain a radiation-sensitive resin composition and the same procedure was followed to evaluate it. The results are shown in Table 1.

Example 3

Except for changing the amount of the sulfonium salt-based photoacid generator (B) constituted by 4-(phenylthio) phenyldiphenylphosphonium tris(pentafluoroethyl)trifluorophosphate from 1 part to 10 parts, the same procedure was followed as in Example 1 to obtain a radiation-sensitive resin composition and the same procedure was followed to evaluate it. The results are shown in Table 1.

Example 4

Except for not mixing the antioxidant (D) constituted by pentaerythritol tetrakis[3-(3,5-di-tert-butyl-4-hydroxyphenyl)propionate], the same procedure was followed as in Example 2 to obtain a radiation-sensitive resin composition and the same procedure was followed to evaluate it. The results are shown in Table 1.

Example 5

Except for using as the cross-linking agent (C), instead of 80 parts of 3,4-epoxy cyclohexenylmethyl-3',4'-epoxycyclohexene carboxylate, 80 parts of epoxylated butanetetracarboxylic acid tetrakis(3-cyclohexenylmethyl)-modified ε-caprolactone (aliphatic cyclic tetrafunctional epoxy resin, product name "Epolide GT401", made by Daicel Chemical Industry), the same procedure was followed as in Example 2 to obtain a radiation-sensitive resin composition and the same procedure was followed to evaluate it. The results are shown in Table 1.

Example 6

Except for using as the cross-linking agent (C), instead of 80 parts of 3,4-epoxy cyclohexenylmethyl-3',4'-epoxycyclohexene carboxylate, 80 parts of 3-ethyl-3{[(3-ethyloxetan-3-yl)methoxy]methyl}oxetane (product name "Aronoxetan OXT-221", made by Toagosei), the same procedure was followed as in Example 2 to obtain a radiation-sensitive resin composition and the same procedure was followed to evaluate it. The results are shown in Table 1.

Example 7

Except for changing the amount of the cross-linking agent (C) constituted by 3,4-epoxy cyclohexenylmethyl-3',4'-epoxycyclohexene carboxylate from 80 parts to 10 parts and further mixing 70 parts of 3-ethyl-3{[(3-ethyloxetan-3-yl)methoxy]methyl}oxetane (product name "Aronoxetan OXT-221", made by Toagosei) as a cross-linking agent (C), the same procedure was followed as in Example 2 to obtain a radiation-sensitive resin composition and the same procedure was followed to evaluate it. The results are shown in Table 1.

Comparative Example 1

Except for using instead of 5 parts of 4-(phenylthio) phenyldiphenylphosphonium tris(pentafluoroethyl)trifluorophosphate as a sulfonium salt-based photoacid generator (B), 5 parts of 4-(phenylthio)phenyldiphenylphosphonium hexafluorophosphate (product name "CPI-100P", made by San-Apro), the same procedure was followed as in Example 2 to obtain the radiation-sensitive resin composition and the same procedure was followed to evaluate it. The results are shown in Table 1.

Comparative Example 2

Except for using instead of 5 parts of 4-(phenylthio) phenyldiphenylphosphonium tris(pentafluoroethyl)trifluorophosphate as a sulfonium salt-based photoacid generator (B), 5 parts of tolylcumyl iodonium tetrakis(pentafluorophenyl)borate (product name "Rhodosil Photoinitiator 2074", made by Rhodia), the same procedure was followed as in Example 2 to obtain the radiation-sensitive resin composition and the same procedure was followed to evaluate it. The results are shown in Table 1.

Comparative Example 3

Except for using instead of 5 parts of 4-(phenylthio) phenyldiphenylphosphonium tris(pentafluoroethyl)trifluorophosphate as a sulfonium salt-based photoacid generator (B), 5 parts of 4-(2-chloro-4-benzoylphenylthio)phenylbis (4-fluorophenyl)phosphonium hexafluoroantimonate) (product name "Adeka Optomer SP-172", made by ADEKA), the same procedure was followed as in Example 2 to obtain the radiation-sensitive resin composition and the same procedure was followed to evaluate it. The results are shown in Table 1.

TABLE 1

|  |  | Examples | | | | | | | Comparative Examples | | |
|---|---|---|---|---|---|---|---|---|---|---|---|
|  |  | 1 | 2 | 3 | 4 | 5 | 6 | 7 | 1 | 2 | 3 |
| Composition of radiation-sensitive resin composition | | | | | | | | | | | |
| Alicyclic olefin polymer which has an acidic group (A-1) | (parts) | 100 | 100 | 100 | 100 | 100 | 100 | 100 | 100 | 100 | 100 |
| 4-(phenylthio)phenyl diphenylphosphonium tris(pentafluoro)trifluorophosphate | (parts) | 1 | 5 | 10 | 5 | 5 | 5 | 5 | | | |
| 4-(phenylthio)phenyl diphenylphosphonium hexafluorophosphate | (parts) | | | | | | | | 5 | | |
| Tolylcumyliodonium tetrakis(pentafluorophenyl)borate | (parts) | | | | | | | | | 5 | |
| 4-(2-chloro-4-benzoylphenylthio)phenyl bis(4-fluorophenyl)phosphonium hexafluoroantimonate | (parts) | | | | | | | | | | 5 |
| 3,4-epoxy cyclohexenyl-methyl-3',4'-epoxy cyclohexene carboxylate | (parts) | 80 | 80 | 80 | 80 | | | 10 | 80 | 80 | 80 |
| Epoxylated butane tetracarboxylic acid tetrakis(3-cyclohexenylmethyl)-modified ε-caprolactone | (parts) | | | | | 80 | | | | | |
| 3-ethyl-3[[(3-ethyloxatan-3-yl) methoxy]methyl]oxetane | (parts) | | | | | | 80 | 70 | | | |
| Pantaerythritol-tetrakis[3-(3,5-di-tert-butyl-4-hydroxyphenyl)propionate] | (parts) | 6 | 6 | 6 | | 6 | 6 | 6 | 6 | 6 | 6 |
| Evaluation | | | | | | | | | | | |
| Exposure sensitivity | (mJ/cm²) | 200 | 160 | 100 | 140 | 180 | 180 | 120 | 400 | 120 | 150 |
| Heat resistant transparency | (%) | 98 | 97 | 93 | 96 | 97 | 97 | 97 | 97 | 80 | 96 |
| Low corrosiveness to metal | | A | A | B | A | A | A | A | C | A | C |

As shown in Table 1, the resin film obtained using a radiation-sensitive resin composition comprising an alicyclic olefin polymer which has an acidic group (A), a sulfonium salt-based photoacid generator (B) represented by the general formula (1), and a cross-linking agent (C) is high in exposure sensitivity and excellent in heat resistant transparency (transparency after baking in an oxidizing atmosphere) and low corrosiveness to metal (Examples 1 to 7).

On the other hand, when using, instead of the sulfonium salt-based photoacid generator (B) represented by the general formula (1), a phosphonium salt with a different anion structure or a sulfonium salt-based compound having a different chemical structure, the obtained resin film is inferior in low corrosiveness to metal (Comparative Examples 1 and 3).

Further, when using, as a photoacid generator, an aromatic iodonium complex salt-based compound, the obtained resin film was inferior in heat resistant transparency (Comparative Example 2).

The invention claimed is:

1. A radiation-sensitive resin composition comprising an alicyclic olefin polymer having an acidic group (A), a sulfonium salt-based photoacid generator (B) represented by the following general formula (1), and a cross-linking agent (C):

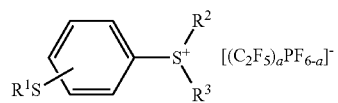
(1)

wherein, in the general formula (1), $R^1$, $R^2$, and $R^3$ respectively independently are a $C_6$ to $C_{30}$ aryl group, $C_4$ to $C_{30}$ heterocyclic group, $C_1$ to $C_{30}$ alkyl group, $C_2$ to $C_{30}$ alkenyl group, or $C_2$ to $C_{30}$ alkynyl group, the groups being optionally substituted, and "a" is an integer of 1 to 5.

2. The radiation-sensitive resin composition according to claim 1, wherein in the general formula (1), $R^1$, $R^2$, and $R^3$ are $C_6$ to $C_{30}$ aryl groups.

3. The radiation-sensitive resin composition according to claim 2, wherein in the general formula (1), $R^1$, $R^2$, and $R^3$ are phenyl groups.

4. The radiation-sensitive resin composition according to claim 1, wherein in the general formula (1), "a" is 3.

5. The radiation-sensitive resin composition according to claim 1, further comprising an antioxidant (D).

6. The radiation-sensitive resin composition according to claim 1, wherein a ratio of content of the sulfonium salt-based photoacid generator (B) is 1 to 15 parts by weight with respect to 100 parts by weight of the alicyclic olefin polymer having an acidic group (A).

7. The radiation-sensitive resin composition according to claim 1, wherein the cross-linking agent (C) is a compound having two or more epoxy groups.

8. The radiation-sensitive resin composition according to claim 1, wherein the cross-linking agent (C) is a compound having two or more oxetanyl groups.

9. The radiation-sensitive resin composition according to claim 7, wherein the cross-linking agent (C) is a combination of a compound having two or more epoxy groups and a compound having two or more oxetanyl groups.

10. An electronic device which is provided with a resin film comprised of a radiation-sensitive resin composition according to claim 1.

* * * * *